(12) United States Patent
Ma

(10) Patent No.: US 6,891,865 B1
(45) Date of Patent: May 10, 2005

(54) WAVELENGTH TUNABLE LASER

(75) Inventor: Yong Ma, Simi Valley, CA (US)

(73) Assignee: Afonics Fibreoptics, Ltd. (GB)

( * ) Notice: Subject to any disclaimer, the term of this patent is extended or adjusted under 35 U.S.C. 154(b) by 0 days.

(21) Appl. No.: 10/077,522

(22) Filed: Feb. 15, 2002

(51) Int. Cl.[7] .............................................. H01S 3/10
(52) U.S. Cl. .............................. 372/20; 372/3; 372/94
(58) Field of Search .............................. 372/3, 20, 94, 372/27, 46

(56) References Cited

U.S. PATENT DOCUMENTS

| | | | |
|---|---|---|---|
| 4,079,339 A | 3/1978 | Kobayashi et al. | 331/94.5 |
| 4,720,160 A | 1/1988 | Hicks, Jr. | 350/96.15 |
| 4,835,778 A | 5/1989 | Kafka et al. | 372/6 |
| 4,852,117 A | 7/1989 | Po | 372/97 |
| 5,004,342 A | 4/1991 | Bernard et al. | 356/350 |
| 5,008,887 A | 4/1991 | Kafka et al. | 272/6 |
| 5,398,256 A | 3/1995 | Hohimer et al. | |
| 5,574,739 A * | 11/1996 | Carruthers et al. | 372/27 |
| 5,790,583 A | 8/1998 | Ho | 372/92 |
| 5,825,799 A | 10/1998 | Ho et al. | 372/92 |
| 5,878,070 A | 3/1999 | Ho et al. | 372/92 |
| 5,878,071 A | 3/1999 | Delavaux | 372/94 |
| 5,926,496 A | 7/1999 | Ho et al. | 372/92 |
| 6,009,115 A | 12/1999 | Ho | 372/92 |
| 6,052,393 A | 4/2000 | Islam | 372/6 |
| 6,052,495 A | 4/2000 | Little et al. | 385/2 |
| 6,252,897 B1 | 6/2001 | Abe | 372/101 |
| 6,344,925 B1 * | 2/2002 | Grubb et al. | 359/345 |

FOREIGN PATENT DOCUMENTS

| | | |
|---|---|---|
| EP | 0 930 679 A2 | 7/1999 |
| EP | 1 058 358 A1 | 12/2000 |
| WO | WO01/18598 A1 | 3/2001 |
| WO | WO 01/38915 A1 | 5/2001 |
| WO | WO 01/45194 A2 | 6/2001 |

OTHER PUBLICATIONS

Absil, P.P. et al., "Vertically Coupled Microring Resonators Using Polymer Wafer Bonding," IEEE Photonics Technology Letters, IEEE, Inc., New York, vol. 13, No. 1, Jan. 2001, pp. 1041–1135.

Wolf, T., et al., "Laser Diodes and Integrated Optoelectronic Circuits for Fiber Optical Applications," European Transactions on Telecommunications and Related Technologies, AEI, Milan, Italy, vol. 4, No. 6, Nov. 1, 1993, pp. 599–614.

\* cited by examiner

*Primary Examiner*—Minsun Oh Harvey
*Assistant Examiner*—Cornelius H. Jackson
(74) *Attorney, Agent, or Firm*—Mintz, Levin, Cohn, Ferris, Glovsky and Popeo, P.C.

(57) ABSTRACT

A wavelength tunable laser comprising a laser diode and a closed external cavity formed by one or more optical resonators either horizontally or vertically coupled to adjacent waveguides. The optical resonator primarily functions as a wavelength selector and may be in the form of disk, ring or other closed cavity geometries. The emission from one end of the laser diode is coupled into the first waveguide using optical lens or butt-joint method and transferred to the second waveguide through evanescent coupling between the waveguides and optical resonator. A mirror system or high reflection coating at the end of the second waveguide reflects the light backwards into the system resulting in a closed optical cavity. Lasing can be achieved when the optical gain overcomes the optical loss in this closed cavity for a certain resonance wavelength which is tunable by changing the resonance condition of the optical resonator through reversed biased voltage or current injection. Multiple optical resonators may be used to reduce the lasing threshold and provide higher power output. With monolithic integration, more optical devices can be integrated with the tunable laser into the same substrate to produce optical devices that are capable of more complex functions, such as tunable transmitters or waveguide buses.

22 Claims, 18 Drawing Sheets

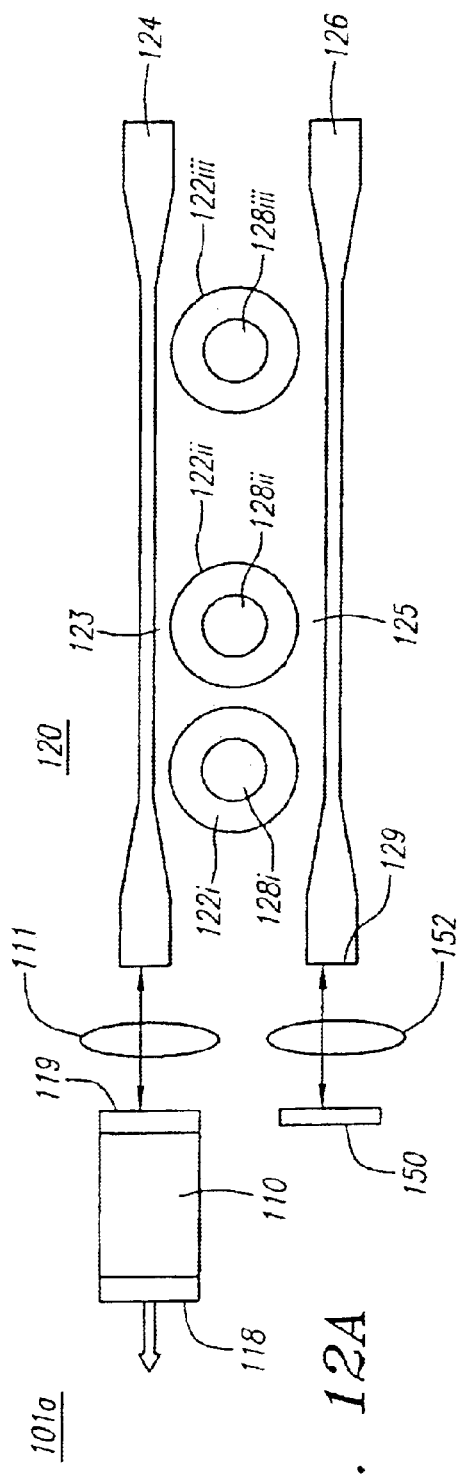
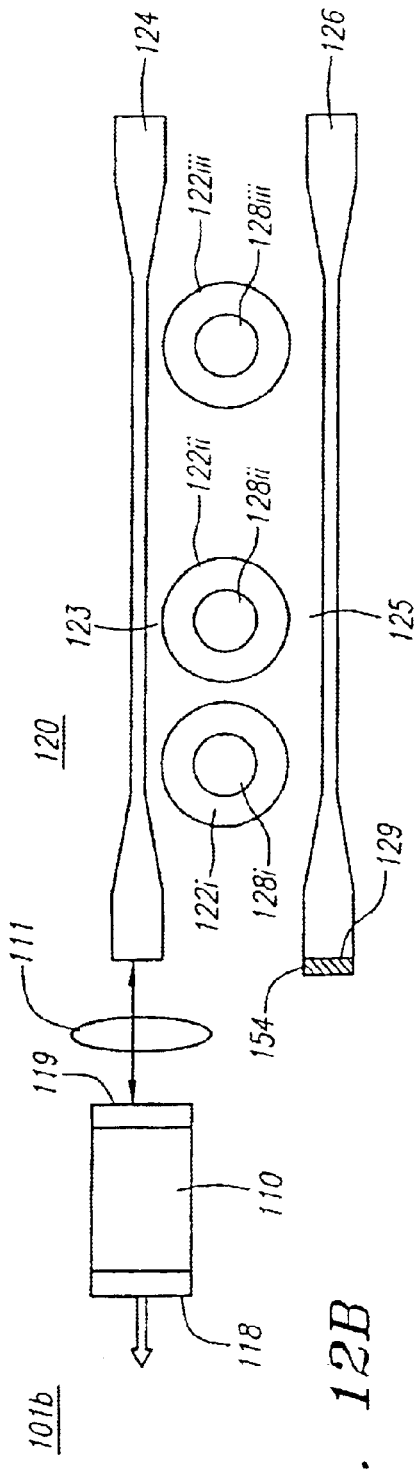
FIG. 12A
FIG. 12B

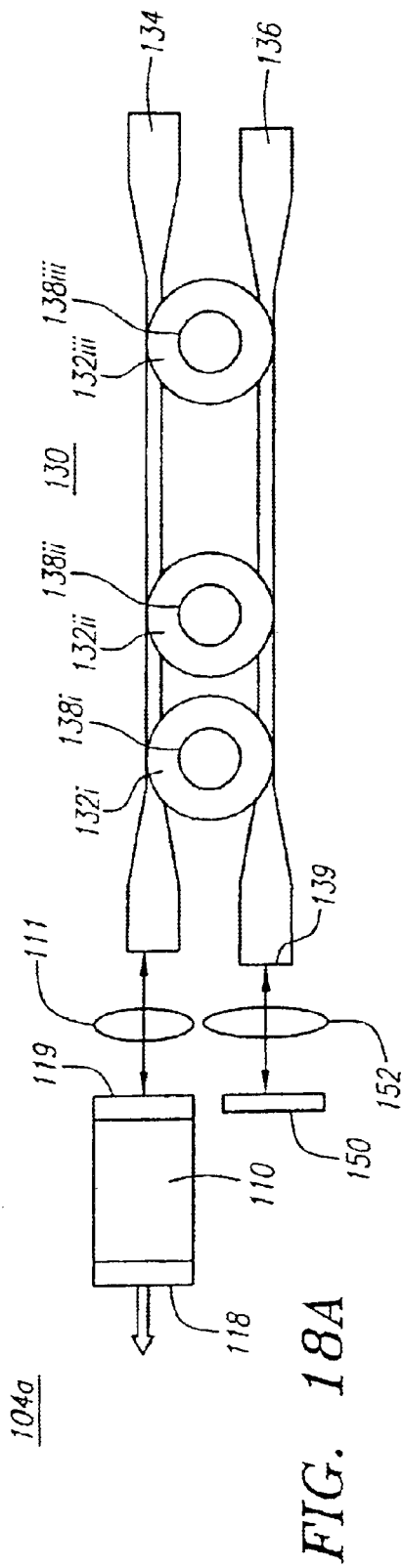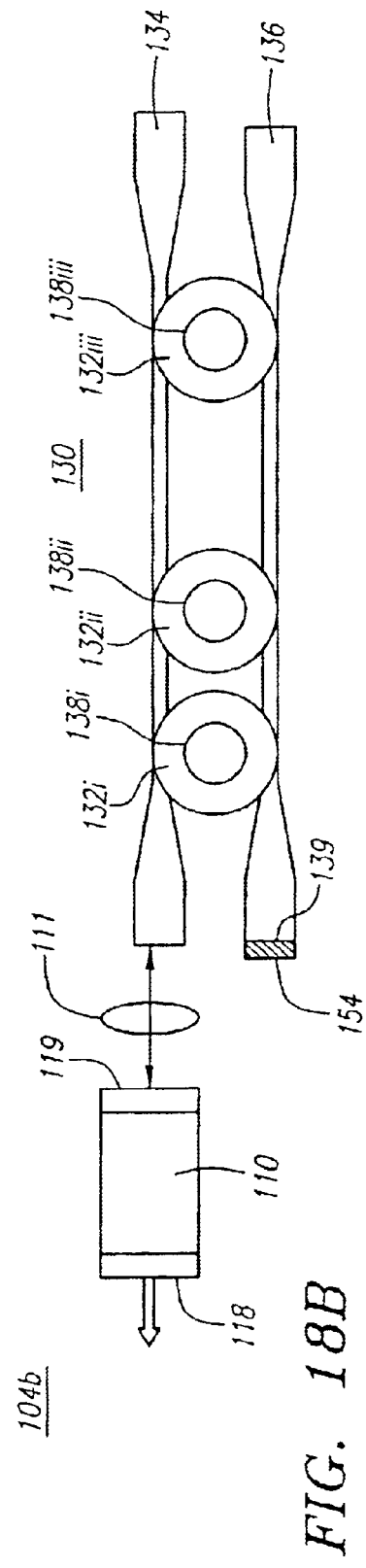

WAVELENGTH TUNABLE LASER

FIELD OF THE INVENTION

The present invention relates to the field of optical communications and more particularly, to a light source with tunable wavelength for use in optical communications systems.

BACKGROUND OF THE INVENTION

The rapid growth of Internet data traffic has driven current fiber optic networks to a new stage where much broader bandwidth and higher capacity are required. Dense wavelength division multiplexed (DWDM) systems with narrow channel spacing and low crosstalk have proven to be a promising solution. Generally in a DWDM system, each channel is represented by a fixed wavelength from a wavelength-fixed laser source and all the different channels are sent into the same optical fiber and transmitted to a receiver end. In order to fully implement a DWDM system with thousands of channels under this wavelength-fixed scheme, service providers in the telecom industry face huge inventory, complexity, and cost problems because of the large number of laser sources and accessories needed, as well as the need for backup lasers and spare parts. However, the use of tunable laser sources in which the lasing wavelength can be tuned over a certain range, for instance, the wavelength band of erbium doped optical-fiber amplifier (EDFA), could dramatically simplify a DWDM system, enable highly flexible and effective utilization of the optical fiber bandwidth, and, thus, can significantly reduce cost to service providers.

Several tunable laser technologies have been investigated over the last decade including distributed feedback Bragg (DFB) grating lasers, distributed Bragg reflector (DBR) laser, vertical-cavity surface-emitting lasers (VCSELs), and external cavity lasers (ECLs). Tunable DFB lasers are in general realized by changing the refractive index of the internal grating either thermally or electrically by which the operating wavelength can be tuned. Although DFB lasers are well behaved and very reliable, they have the disadvantages of low output power and very limited wavelength tuning range (i.e., a range of about 5.0 nm).

DBR lasers have similar structures to DFB lasers but have a grating section separated from an active section. By injecting current into the grating region to change the refractive index, the effective length of the laser cavity is changed and therefore the lasing wavelength. DBR lasers have some advantages such as fast tuning speed, relatively large tuning range (about 40 nm), but suffer drawbacks of wavelength instability, broad linewidth, and large device size.

VCSELs have a gain layer sandwiched by two DBR mirrors. The light is emitted from the top surface of the mirror instead of the edge as in the conventional edge-emitting lasers. This gives VCSELs the biggest advantage in that the laser output can be coupled to a fiber very easily and cost-effectively. The wavelength tuning of VCSELs is realized by injecting current to a micro-electromechanical-systems (MEMS) cantilever integrated with the top DBR mirror thereby changing the cavity thickness. The use of MEMS tends to limit the tuning speed of the device within the microsecond range. However, the main disadvantage of VCSELs is that they tend to have low output power (i.e., on the order of about hundreds of microwatts or lower). Another disadvantage of traditional VCSELs is their operational wavelengths are limited to short wavelengths of about 850 nm to about 1300 nm.

ECLs basically utilize an external reflector such as a diffracting grating or MEMS mirror to form an external cavity. By mechanically adjusting the external cavity length, the lasing wavelength can be tuned over a wide range. ECLs can also provide high output power and narrow linewidth. However, most of current ECLs are very large, costly, sensitive to environmental changes, and operate with a slow tuning speed on the order of milliseconds. In addition, current ECL designs tend not to be applicable to large-scaled integration.

SUMMARY OF THE INVENTION

The present invention is directed to an improved tunable wavelength light source for use in optical communications systems that facilitates high speed, broad band wavelength tuning, is mechanically simple, scalcable and reliable, and facilitates monolithic integration of optical components. The novel wavelength tunable light source of the present invention preferably comprises a semiconductor laser diode optically coupled to a tunable wavelength selective external cavity. Preferably, the external cavity comprises a waveguide-coupled optical resonator that includes an optical resonator, or multiple optical resonators, either horizontally or vertically coupled to adjacent semiconductor waveguides. The optical resonator, which is preferably formed from electro-optic materials, primarily functions as a wavelength selector and can be in the form of a disk, ring or other closed cavity geometries. In operation, light signal emissions from one end of the semiconductor laser may be coupled into a first waveguide using an optical lens or butt-joint method, and then transferred to a second waveguide through evanescent coupling between the waveguides and the optical resonator when the wavelength of the light signal is at a resonance frequency of the resonator. A mirror system or high reflection coating at the end of the second waveguide reflects the light signal back into the system. A closed optical cavity is realized as a result.

Lasing can be achieved in the light source of the present invention when the optical gain overcomes the optical loss in the closed cavity for a certain resonance wavelength. The resonance wavelength is preferably tunable by changing the resonance condition of the optical resonator through current or reversed biased voltage. For a given material and structure, the wavelength tunable range tends to be determinable by the size of the resonator. The use of multiple optical resonators advantageously tends to reduce the lasing threshold and tends to provide higher power output.

When compared to traditional ECL designs, the wavelength tunable laser of the present invention tends to possess several advantages. For instance, the present invention tends to be smaller in size because of its use of compact waveguide-coupled optical resonators as the external cavity. The tunable laser of the present invention also tends to have much faster tuning speeds because the tuning mechanisms use electro-optic effects or carrier effects instead of thermal or MEMS effects. Lastly, the semiconductor laser diode and the optical resonators forming the tunable laser of the present invention may be fabricated on the same substrate and, thus, facilitate monolithic integration.

In preferred embodiments, the semiconductor laser diode has one end facet anti-reflection coated from which light emissions are coupled into the first waveguide of the waveguide-coupled optical resonator using a high numeric aperture lens. The two coupling waveguides of the waveguide-coupled optical resonator are preferably designed, for example, using a tapered structure to take advantage of mode matching between the waveguide and optical resonators in the interaction region of the device. A high reflection coating is applied at one end of the second waveguide forming a closed optical cavity. As a result, the power transferred from the first waveguide through the optical resonator(s) can be totally reflected back into the system. When one of the cavity modes (represented by a particular wavelength or frequency) is at resonance with the optical resonator(s), i.e., the wavelength is one of the resonance wavelengths of the optical resonator, and has enough optical gain through current injection into the laser diode to compensate for the optical loss encountered in the closed cavity, lasing from the other end facet of the laser diode may be achieved at this particular wavelength. The resonance wavelength of the optical resonators may be adjusted or tuned by applying voltage or injecting current to the resonator. Therefore, the lasing wavelength of the tunable laser of the present invention may be tuned. The tuning range is determined by the free spectral range of the optical resonators.

In other preferred embodiments, a mirror with 100% reflectivity placed right after the end facet of the second waveguide reflects the transferred power back into the system. This mirror could be movable to adjust the distance between the mirror and the waveguide and, thus, change the length of the cavity.

In yet other preferred embodiments, the coupling waveguides may include an active medium. By injecting current into one or more sections of the coupling waveguides, for example, at the end of the second waveguide, additional optical gain is provided for the light and lower threshold lasing can be achieved.

A significant advantage of the tunable laser of the present invention, as compared to other ECL designs, is that monolithic integration tends to be possible. For example, the laser diode is fabricated first on an InP substrate. The optical resonators and coupling waveguides are then fabricated on the same substrate by using regrowth methods and other standard semiconductor fabrication processes. The emission of the laser diode is coupled into the first coupling waveguide through butt-joint methodology. In the same way, other optical devices can be integrated onto the same substrate and more complex functions can be realized. For example, an electro-absorption modulator may be fabricated right after the tunable laser wherein the output from the tunable laser may be modulated or another waveguide-coupled optical resonator may be coupled to the outputs from different tunable lasers to multiplex these outputs.

Other aspects and features of the present invention will become apparent from consideration of the following description taken in conjunction with the accompanying drawings.

BRIEF DESCRIPTION OF THE DRAWINGS

FIG. 12A is a schematic view of a second embodiment of a tunable laser of the present invention similar to that shown in FIG. 6A except for the use of multiple optical resonators.

FIG. 12B is a schematic view of an alternative to the second embodiment of a tunable laser of the present invention shown in FIG. 12A and similar to that shown in FIG. 6B except for the use multiple optical resonators.

FIG. 18A is a schematic view of a fifth embodiment of a tunable laser of the present invention similar to that shown in FIG. 16A except for the use of multiple optical resonators.

FIG. 18B is a schematic view of an alternative to the fifth embodiment of a tunable laser of the present invention shown in FIG. 18A and similar to that shown in FIG. 16B except for the use multiple optical resonators.

DETAILED DESCRIPTION OF THE INVENTION

Referring in detail to the figures, a wavelength tunable laser of the present invention, as shown, combines a semiconductor laser diode with a waveguide-coupled optical resonator. The waveguide-coupled optical resonator serves as a wavelength selective, external cavity to realize a tunable laser by applying voltage or injecting current to change the resonance wavelength of the resonator(s).

Figure 1:
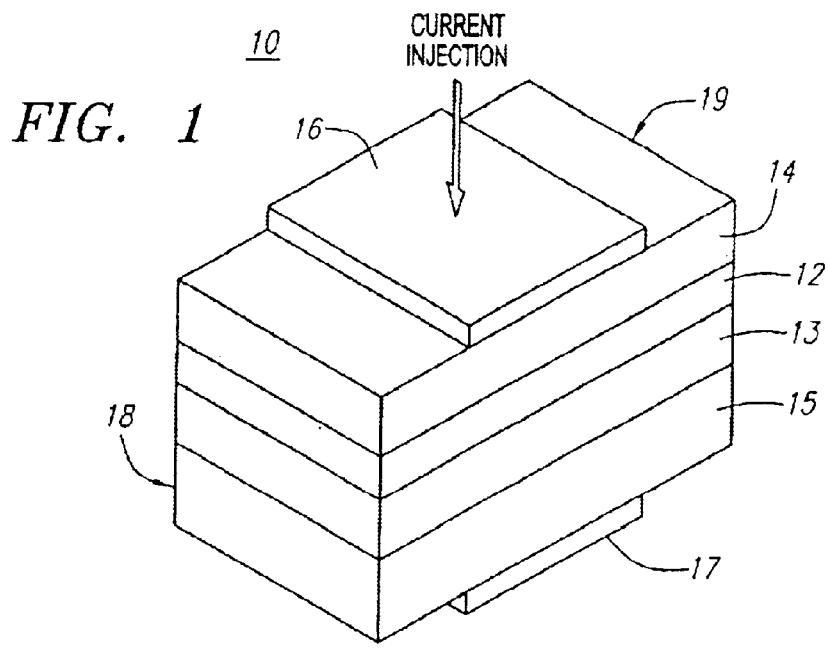
FIG. 1 is a schematic view of an edge-emitting Fabry-Perot laser diode with a typical pin wafer structure with two end facets serving as the two reflective mirrors of a laser cavity by cleaving the laser chip.

Turning to FIG. 1, a multi-layer semiconductor wafer structure of a laser diode 10 of the present invention is shown. The laser diode 10 preferably comprises an active or guiding layer 12 sandwiched between two cladding layers 13 and 14 on a substrate 15. The active layer (guiding) 12 is preferably non-doped or insulated and has a higher refractive index (n) and a smaller bandgap than the two cladding layers 13 and 14. The two cladding layers 13 and 14 are preferably highly doped with either n-type or p-type doping in order to reduce contact resistance. The substrate 15 is preferably more highly doped with either n-type or p-type doping. This structure 10 provides good confinement for both photons and carriers as a result. Electrodes or electrical contacts 16 and 17 are formed on the top and bottom of the structure 10 to apply voltage or inject current. In a preferred construction, the structure 10 includes a n-doped substrate 15, a n-doped first cladding layer 13 positioned on top of the substrate 15, a non-doped guiding layer 12 positioned on top of the first cladding layer 13, a p-doped second cladding layer 14 positioned on top of the guiding layer 12, a negative electrical contact 17 positioned on the bottom of the substrate 15 and a positive electrical contact 16 positioned on top of the second cladding layer 14.

The wafer structure 10 is preferably cleaved along its crystal plane forming two end facets 18 and 19. The end facets 18 and 19 typically act as mirror surfaces that reflect light beams back and forth within the active layer 13; wherein the end facets 18 and 19 and active layer 13 form a Fabry-Perot (F-P) cavity. However, as discussed in greater detail below, when incorporated as part of a tunable laser cavity of the present invention, one of the end facets of the laser diode would preferably be coated with an anti-reflection (A.R.) coating. The A.R. coating allows light to be spontaneously emitted from the A.R. coated end facet when current is injected into the laser diode.

The resonance wavelength of a typical F-P cavity is given by $$\lambda_q = \frac{c}{2qnl}, q = 1, 2 \dots \qquad (1)$$

where c is the light speed in free space, n is the refractive index of the active medium (layer 12), and l is the cavity length. The optical loss comes from the absorption of the active medium and the partial reflections at the two end facets. The loss coefficient per round trip for the light is given by $$\alpha = \alpha_s + \alpha_m = \alpha_s + \alpha_{m1} + \alpha_{m2} = \alpha_s + \frac{1}{2l}\ln\frac{1}{R_1 R_2} \quad (2)$$

where $\alpha_s$, is the absorption loss coefficient, $\alpha_m$ is the mirror loss coefficient due to the partial reflections and $R_1$, $R_2$ are the power reflectivities at the two end facets. At the semiconductor-air interface, the reflectivity is usually given by $$R = \left(\frac{n-1}{n+1}\right)^2.$$

For III-V semiconductor materials, the refractive index (n) is about 3.4, therefore R≈30%. See, e.g., *Advanced III-V Compound Semiconductor Growth, Processing and Devices* (*Materials Research Society Symposium Proceedings, Vol. 240* (Pearton et al. (Ed.)). When one of the resonance wavelengths of this cavity has a gain in the active medium large enough to overcome the optical loss incurred over a round trip through the cavity, lasing oscillation may result at this particular wavelength.

For use in optical transmission systems based on fiber optics, the useful lasing wavelengths, or optical fiber windows, tend to be 1.3 and 1.55 µm because of the minimal dispersion losses at 1.3 µm and minimal absorption losses at 1.55 µm. Thus, in order to emit light at these wavelengths the laser diode 10 of the present invention is preferably formed from InP material. However, for other applications the laser diode may be formed from other material systems. For example, for use in short distance communications across copper cables, the laser diode may be formed from an InGaAsP/InP material system, which has a lasing wavelength at about 860 nm.

Turning to FIGS. 2A, 2B, 3A, 3B, 3C, 4A, and 4B, illustrative embodiments of the waveguide-coupled optical resonators 20, 30 and 40 of the present invention are shown. As depicted, the multi-layer semiconductor wafer structures of the waveguide-coupled optical resonators 20, 30, and 40 include a circular or disk-shaped resonator cavity 22, 32 and 42 and two adjacent waveguides 24 and 26, 34 and 36, and 44 and 46, respectively, formed as a single chip structure. Preferably, the waveguides, which are either horizontally or vertically coupled to the resonators through evanescent wave coupling, are tapered in structure, wherein the ends are thicker than a central portion. The tapered structure of the waveguides enables the waveguide-coupled optical resonators to take advantage of mode (i.e., wavelength) matching between the waveguides and the resonator at an interaction region 27, 37 and 47 of the chip.

Figure 2A:
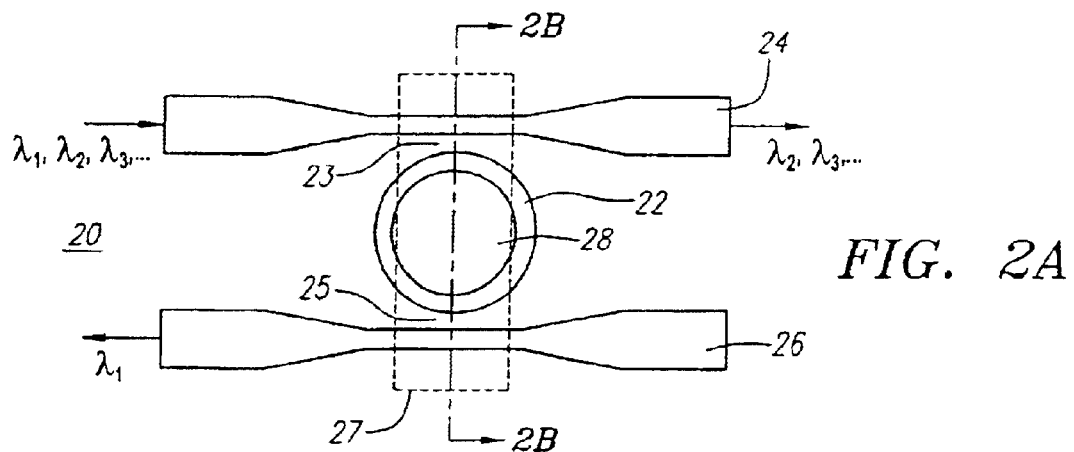
FIG. 2A is a schematic view of a waveguide-coupled optical resonator system with two waveguides horizontally coupled to a resonator.
Figure 2B:
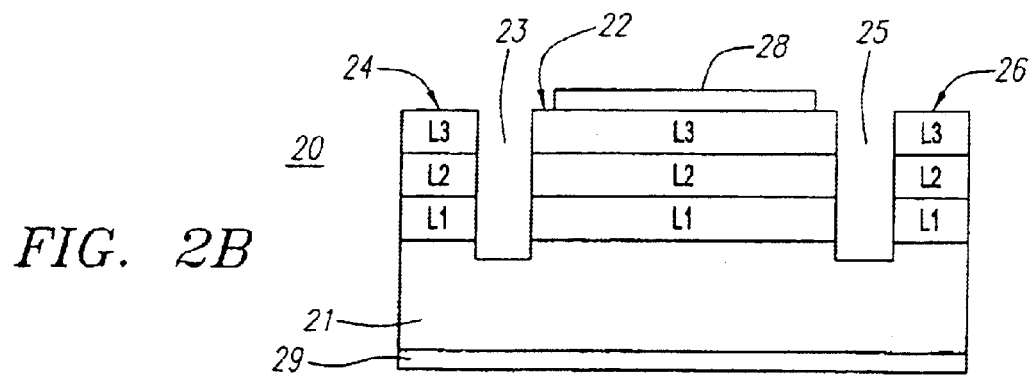
FIG. 2B is a cross-sectional view of the waveguide-coupled resonator system shown in FIG. 2A and taken along line 2B—2B.

Referring to FIGS. 2A and 2B, a horizontally coupled waveguide-coupled resonator 20 is shown to preferably comprise a resonator 22 and first and second waveguides 24 and 26 formed on top of a highly n-doped substrate 21, wherein the waveguides 24 and 26 are spaced apart from the resonator 22 across predetermined coupling gaps 23 and 25. The resonator 22 and waveguides 24 and 26 preferably include a first layer L1, which is preferably a n-doped cladding layer, positioned on top of the substrate 21, a second layer L2, which is preferably a non-doped active or guiding layer, positioned on top of the first layer L1, and a third layer L3, which is preferably a p-doped cladding layer, positioned on top of the second layer L2. A positive electrode contact 28 is positioned on top of the resonator 22 and a negative electrode contact 29 is positioned on the bottom of the substrate 21.

The horizontally coupled waveguide-coupled optical resonator 20 may be formed using electron beam (e-beam) lithography and standard semiconductor fabrication processes, such as plasma-enhanced chemical vapor deposition (PECVD), reactive ion etching (RIE), and inductively coupled plasma (ICP) etching. The coupling between the resonator 22 and the waveguides 24 and 26 is controlled by varying the size of the gaps 23 and 25 between the waveguides 24 and 26 and the resonator 22. The gap size is preferably small enough to enable evanescent coupling, which occurs through the evanescent wave of guided light. The evanescent wave is the tail of the guided light that extends beyond the waveguide layer as the light propagates along the waveguide. The tail decays as the distance away from the center of the guiding layer increases, and becomes zero at infinite. If two waveguides are placed sufficiently close together, the tail of the light guided in a first waveguide will overlap the adjacent guiding layer enabling the light signal to be coupled into the second waveguide.

The gap size is also related to the coupling efficiency between the waveguide and the resonator. Theoretically, the value of the coupling efficiency is not critical in order to have 100% power transfer. As discussed in greater detail below, as long as the coupling is balanced and the resonator is optically lossless, 100% power transfer is possible when the wavelength of the light signal is at resonance, even if the coupling efficiency is very small. However, in reality, optical losses do exist in the resonator. If the coupling efficiency is too small, the optical power transferred into the resonator will disappear after it travels a very short distance and, as a result, may not reach the other coupling or interaction region. Thus, a certain level of coupling efficiency, which is basically determinable by gap size and waveguide structure, is needed. The smaller the gap size, the larger the coupling efficiency tends to be. A gap size of 0.2 um accompanied by the tapered waveguide structures of the present invention, tends to provide a coupling efficiency of 2–3%. With current fabrication technologies, such as e-beam lithography, a gap size as small as 0.1 um may be achieved. Therefore, in order to enable evanescent coupling and sufficient coupling efficiency, the size of the coupling gaps 23 and 25 is preferably about 0.1–0.2 microns. As fabrication technologies advance, a gap size smaller than 0.1–0.2 microns may be more desirable.

Figure 3A:
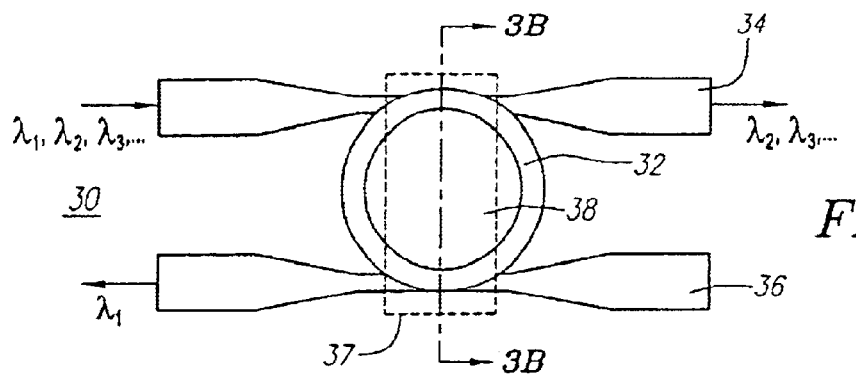
FIG. 3A is a schematic view of a waveguide-coupled optical resonator system with two waveguides positioned below and vertically coupled to a resonator.
Figure 3B:
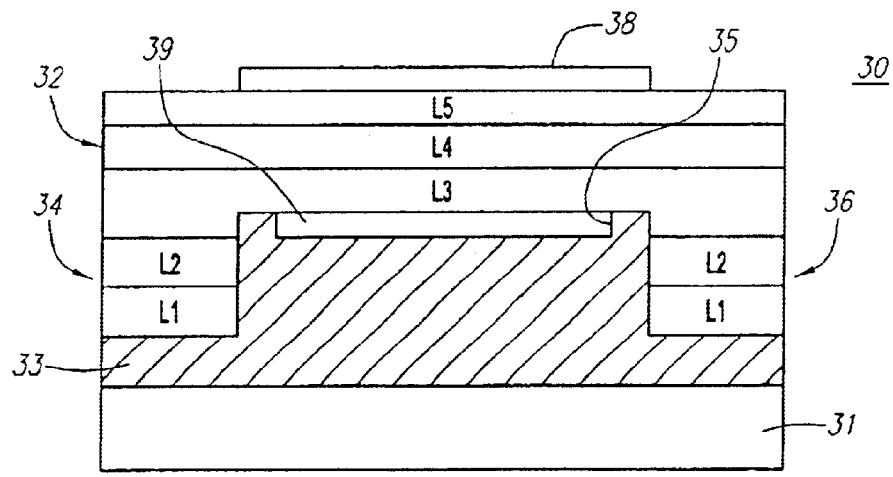
FIG. 3B is a cross-sectional view of the waveguide-coupled resonator system shown in FIG. 3A and taken along line 3B—3B.

Turning to FIGS. 3A and 3B, a vertical coupling waveguide-coupled optical resonator 30 is shown to preferably include a resonator 32 and first and second waveguides 34 and 36 formed on top of a patterned polymer wafer 33 positioned on top of a transfer substrate 31. The waveguides 34 and 36, which are formed in the same layer, preferably include a first layer L1, which is preferably a non-doped cladding layer, positioned on opposite sides and on top of the polymer wafer 33 and a second layer L2, which is preferably a non-doped guiding or active layer, positioned on opposite sides of the polymer wafer 33 and on top of the first layer L1. The resonator 32 preferably includes a third layer or separation layer L3, which is preferably a n-doped cladding layer, positioned on top of the second layer L2 and a top portion of the polymer wafer 37, a fourth layer L4, which is preferably a non-doped guiding or core layer, positioned on top of the third layer L3, and a fifth layer L5, which is preferably a p-doped cladding layer, positioned on top of the fourth layer L4. A negative electrode contact 39 is preferably deposited in a recess 35 formed in the top of the polymer wafer 33 adjacent the third n-doped cladding layer L3. A positive electrode contact 38 is deposited on top of the fifth p-doped cladding layer L5.

Figure 3C:
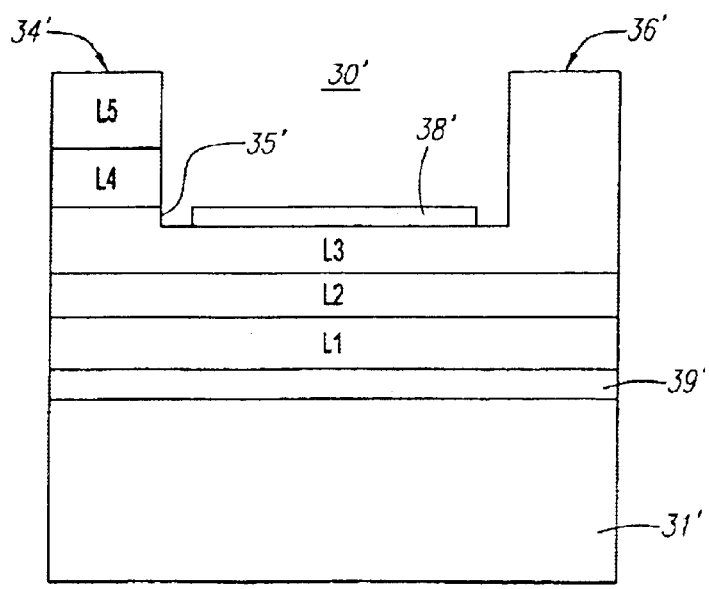
FIG. 3C is a cross-sectional view of an alternative waveguide-coupled resonator system with two waveguides positioned above and vertically coupled to a resonator.

FIG. 3C provides an alternative vertical coupling geometry wherein the waveguide-coupled optical resonator 30' preferably includes first and second waveguides 34' and 36' positioned on top of a resonator 32'. Specifically, the waveguide-coupled optical resonator 30' includes a positive electrode contact 39' deposited on top of a transfer substrate 31'. The resonator 32' preferably includes a first layer L1, which is preferably a p-doped cladding layer, positioned on top of the positive electrode contact 39', a second layer L2, which is preferably a non-doped guiding or core layer, positioned on top of the first layer L1, and a third or separation layer L3, which is preferably a n-doped cladding layer, positioned on top of the second layer L2. A negative electrode contact 35' is preferably deposited in a recess 35' formed in the top of the third layer L3. The waveguides 34' and 36', which are formed in the same layer, preferably include a fourth layer L4, which is preferably a non-doped guiding layer, positioned on opposite sides of the negative electrode 38' and on top of the third layer L3, and a fifth layer L5, which is preferably a non-doped cladding layer, positioned on top of the fourth layer L4.

Figure 4A:
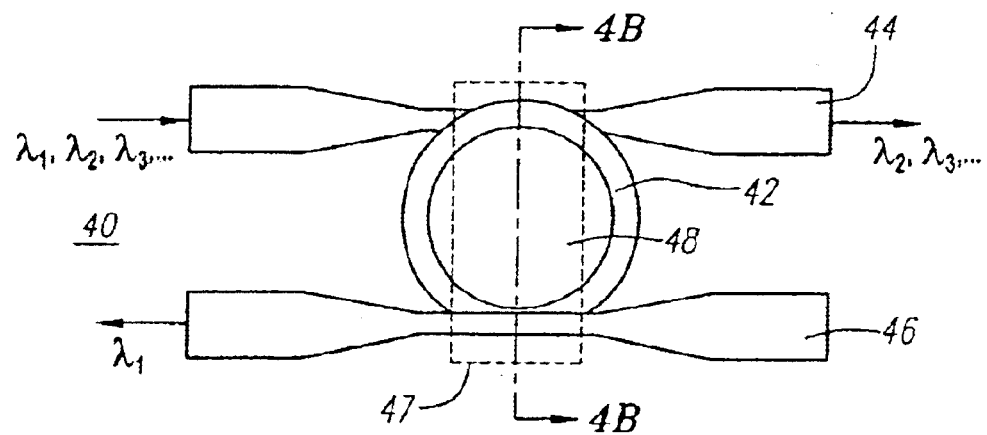
FIG. 4A is a schematic view of a waveguide-coupled optical resonator system with two waveguides positioned above and below and vertically coupled to a resonator.
Figure 4B:
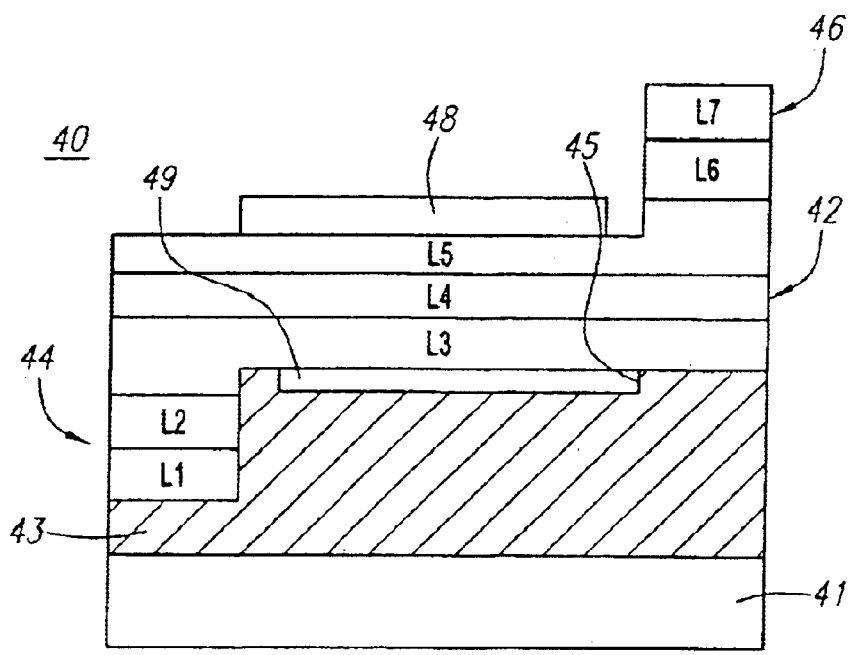
FIG. 4B is a cross-sectional view of the waveguide-coupled resonator system shown in FIG. 4A and taken along line 4B—4B.

FIGS. 4A and 4B provide another alternative vertical coupling geometry wherein first and second waveguides 44 and 46 of the waveguide-coupled optical resonator 40 are formed in different layers, i.e., L2 versus L6; one positioned underneath a resonator 42 and the other positioned above the resonator 42. As shown in FIG. 4B, the waveguide-coupled optical resonator structure 40 comprises a transfer substrate 41 upon which a patterned polymer wafer 43 is positioned. The first waveguide 44 includes a first layer L1, which is preferably a non-doped cladding layer, positioned on top of a side portion of the polymer wafer 43, and a second layer L2, which is preferably a non-doped guiding layer, positioned on top of the first layer L1. The resonator 42 preferably includes a third layer or separation layer L3, which is preferably a n-doped cladding layer, positioned on top of the second layer L2 and a top portion of the polymer wafer 43, a fourth layer L4, which is preferably a non-doped guiding or core layer, positioned on top of the third layer L3, and a fifth or separation layer L5, which is preferably a p-doped cladding layer, positioned on top of the fourth layer L4. The second waveguide 46 preferably includes a sixth layer L6, which is preferably a non-doped guiding layer, positioned on top of the fifth layer L5 on a side opposite the first waveguide 44, and a seventh layer L7, which is preferably a non-doped cladding layer, positioned on top of the sixth layer L6. A negative electrode contact 49 is preferably deposited in a recess 45 formed in the polymer wafer 43 adjacent the third n-doped cladding layer L3. A positive electrode contact 48 is deposited on top of the fifth p-doped cladding layer L5.

For the vertical coupling waveguide-coupled optical resonators 30, 30' and 40 of the present invention, the coupling tends to be controlled by varying the thickness of the separation layer, i.e. n-doped cladding layer L3 in FIGS. 3B and 3C and n-doped and p-doped cladding layers L3 and L5 in FIG. 4B, which can be precisely formed through epitaxial growth. As a result, the tolerances for vertical coupling geometry tends to be much higher than the tolerances for horizontal coupling geometry. Because the tolerances for vertical coupling geometry are not as tight as those for horizontal coupling geometry, vertical coupling geometry can advantageously be realized using traditional photolithography techniques, which are more efficient than e-beam lithography techniques.

In addition, the layered structures of the vertical coupling geometry may be formed using polymer, direct or anodic wafer bonding techniques, which enable metal electrode contacts to be deposited on or between layers. Polymer wafer bonding, for instance, enables bonding of two different wafers together by using an organic polymer as the intermediate medium. Compared with other bonding methods, polymer wafer bonding is simpler and requires relatively lower processing temperatures. The polymer may be any commercial polymer used for bonding. Preferably, Benzocyclobutenes (BCBs) polymers, which are a relatively new class of organic polymers, are used in the layer structures of the present invention.

To form the structures shown in FIGS. 3B and 4B, a layer of $SiO_2$, about 400 nm thick, is first deposited as the etching mask on a patterned epi-wafer 33 and 43. Conventional optical lithography plus standard semiconductor fabrication processes are then used to make the coupling waveguide(s) 34, 36 and 44 on the wafer 33 and 43. Metal is then deposited on the surface of the wafer 33 and 43 to from an Ohmic contact 39 and 49. Next, BCB is spun on the bottom of the patterned wafer 33 and 43 and a transfer substrate 31 and 41, which is preferably different from the epi-wafer substrate. The patterned wafer 33 and 43 is then flipped over and placed down onto the transfer substrate 31 and 41. The two wafers are tightened together. Next, the combined wafer is put into a $N_2$ filled furnace. The temperature is raised to 250° C. and the wafer is baked for about an hour, and then allowed to cool down. After being fully cured, the BCB layer acts as glue and can bond the two wafers together very tightly. The thickness of the BCB layer is chosen to be thick enough to prevent optical leakage into the transfer substrate 31 and 41. However, if it is too thick, it is difficult to get a good facet quality after cleaving. After the wafer is removed from the furnace, the epi-wafer's substrate is removed using selective wet etching. The resonator 32 and 42 is then fabricated, using standard semiconductor fabricating processes, on the wafer 33 and 43 and is well-aligned with the coupling waveguides 34, 36 and 44. Lastly, metal is deposited on the surface of the resonator 32 and 42 to form an Ohmic contact 38 and 48. If the coupling waveguides 44 and 46 are on different sides of the resonator 42, the second coupling waveguide 46 is then fabricated on the resonator 42 and is well aligned to the resonator 42.

Referring to FIG. 3C, the layered structure is preferably formed by direct or anodic wafer bonding methods. Direct wafer bonding utilizes surface attraction forces by putting two ultra-cleaned wafer surfaces together with a certain pressure and/or high temperature annealing process. Anodic wafer bonding basically occurs by applying an electrical field across the two wafers.

Figure 5:
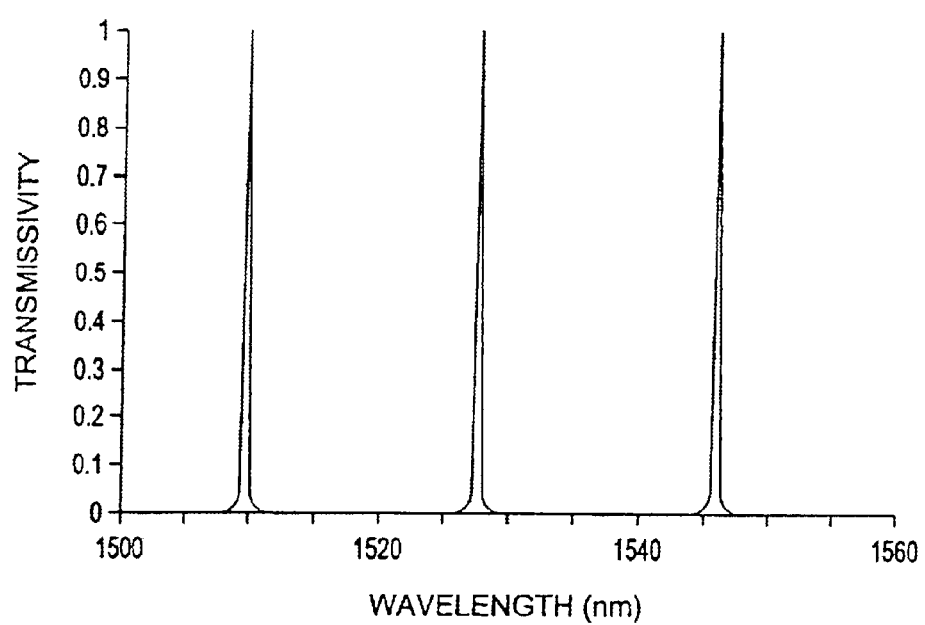
FIG. 5 is a graph showing a typical resonance spectrum of a resonator made from typical semiconductor materials with a 10 $\mu$m diameter.

In operation, light beams tend to propagate inside the resonators 22, 32 and 42 along the circumference of the resonators 22, 32 and 42 by total reflections in what is commonly referred to as the "Whispemmg-Gallery" mode. Such a propagation mode usually has a very high Q value due to the strong mode confinement and low optical loss in the cavity. The mode Q value describes the optical mode loss in a cavity, wherein a high Q value corresponds to a lower loss, and is defined as $$Q = \frac{\lambda_{res}}{\delta\lambda} \tag{3}$$

where $\lambda_{res}$ is the resonance wavelength of the resonator, $\delta\lambda$ is the full resonance linewidth at half-maximum resonance. FIG. 5 shows a typical resonance spectrum of a resonator with a 10 $\mu$m diameter made from typical semiconductor materials corresponding to a center working wavelength of 1500 nm. From FIG. 5, we can see that the spectrum has a free spectral range (FSR) of 20 nm and the Q value is about 5000, for a resonance wavelength of about 1550 nm and a resonance linewidth of about 0.31 nm. The FSR describes the separation between two adjacent resonances. In wavelength domain, FSR is given by $$\Delta \lambda \approx \frac{\lambda_m^2}{2\pi R n} \quad (4)$$

where $\lambda_m$ is the center-working wavelength and R is the resonator radius. To increase the FSR, smaller resonators are preferred.

With coupling waveguides, the optical resonator can have versatile functions. However, the main function of the waveguide-coupled optical resonators 20, 30 and 40 of the present invention is as a wavelength selector. Referring to FIGS. 2A, 3A and 4A, input light beams with different wavelengths $\lambda_1, \lambda_2, \lambda_3, \ldots$ enter the first waveguide 24, 34 and 44 and are coupled from the first waveguide 24, 34 and 44 into the resonator 22, 32 and 42 either horizontally or vertically at the interaction region 27, 37 and 47 through the evanescent wave (i.e., evanescent coupling) of the light beam when the wavelength of the light beam is at a resonance wavelength or frequency of the resonator 22, 32 and 42; for instance, $\lambda_1$. The light beam with wavelength $\lambda_1$ then circulates inside the resonator 22, 32 and 42, and builds up to large intensities. At the same time, it is coupled out of the resonator 22, 32 and 42 into the second waveguide 26, 36 and 46 through the evanescent wave of the light beam at the interaction region 27, 37 and 47. The rest of the input light signals, i.e., $\lambda_2, \lambda_3, \ldots$, just pass through and exit the other end of the first waveguide 24, 34 and 44. Resonance wavelength tuning can easily be achieved by either applying a voltage or injecting current to the resonator 22, 32 and 42. In this way, the optical power associated with a particular wavelength can be transferred from one side of the waveguide-coupled optical resonator 20, 30 and 40 to the other side. In an ideal case, 100% of the optical power associated with a selected wavelength is transferred from one side of the waveguide-coupled optical resonator to the other. Realization of 100% power transfer, however, tends to require that the following three conditions be satisfied:

(1) The wavelength is at resonance;
(2) There is no optical loss in the resonator cavity; and
(3) The coupling on each side should be equal, i.e., the coupling is balanced, and lossless.

Figure 6A:
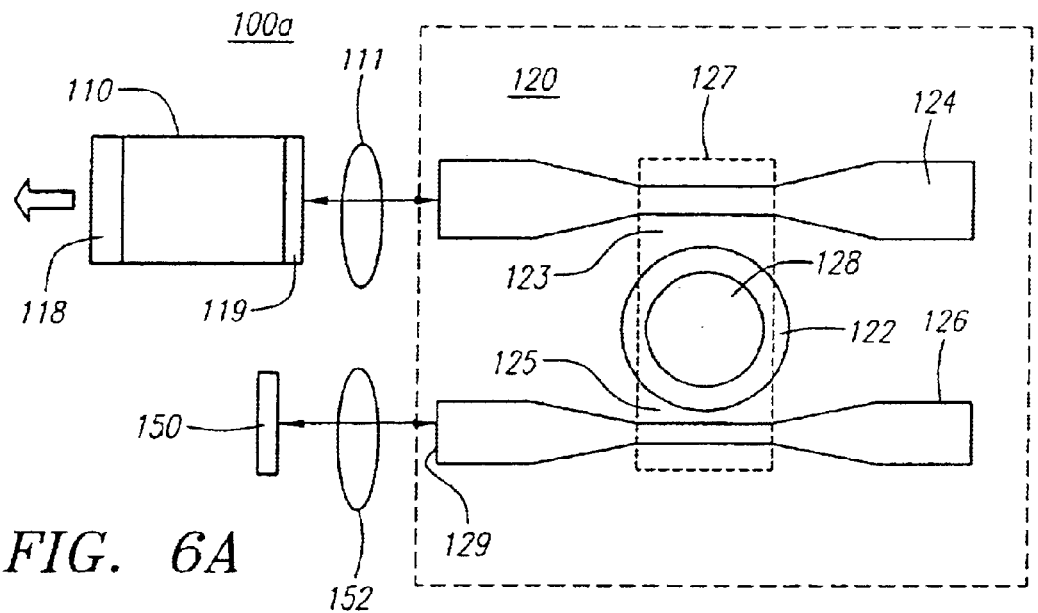
FIG. 6A is a schematic view of a first embodiment of a tunable laser of the present invention including a laser diode coupled to a waveguide-coupled optical resonator system with two waveguides horizontally coupled to an optical resonator.

Referring to FIG. 6A, a first illustrative embodiment of a wavelength tunable laser 100a of the present invention is shown to include a semiconductor laser diode 110, with opposing end facets 118 and 119, that is optically coupled through a coupling lens 111, having a high numeric aperture (N.A.), to a waveguide-coupled optical resonator 120. The laser diode 110, which is formed from broad gain spectrum material, has substantially the same structure as the laser diode 10 shown in FIG. 1 with the exception of the end facet 119 facing the waveguide-couple resonator 120 being coated with an A.R. coating. The waveguide-coupled resonator 120, which has substantially the same structure as the waveguide-coupled resonator 20 shown in FIGS. 2A and 2B, includes a circular or disk-shaped resonator cavity 122 with an electrode contact 128 shown positioned on top of the resonator 122. An additional electrode contact (not shown) may be positioned below the resonator 122 as shown in FIG. 2B. The resonator 122 is spaced apart from first and second waveguides 124 and 126 across coupling gaps 123 and 125.

The waveguides 124 and 126, which preferably include a tapered structure, are positioned in parallel orientation on opposite sides of the resonator 122. The tunable laser 100a further includes a collimated tens 152 and a mirror 150, preferably with 100% reflectivity, positioned adjacent to one end facet 129 of the second waveguide 126.

In operation, current is applied to the laser diode 110 at a level below the lasing threshold of the laser diode 110 to generate spontaneous light emissions from the A.R. coated end facet 119 of the laser diode 110. The light emissions are coupled into the first waveguide 124 of the waveguide-coupled resonator 120 through the coupling lens 111. The light propagates through the first waveguide 124 and reaches the interaction area 127 of the first waveguide 124 and the resonator 122. Light having a wavelength associated with a resonance frequency of the resonator 122 is horizontally coupled into the resonator 122 through evanescent coupling across the first coupling gap 123. As the light propagates within the resonator 122, the light is horizontally coupled into the second waveguide 126 through evanescent coupling across the second coupling gap 125 at the interaction area 127 of the second waveguide 126 and the resonator 122. Thus, a certain portion of the input optical power from the laser diode 110 is transferred from the first coupling waveguide 124 to the second coupling waveguide 126.

Figure 6B:
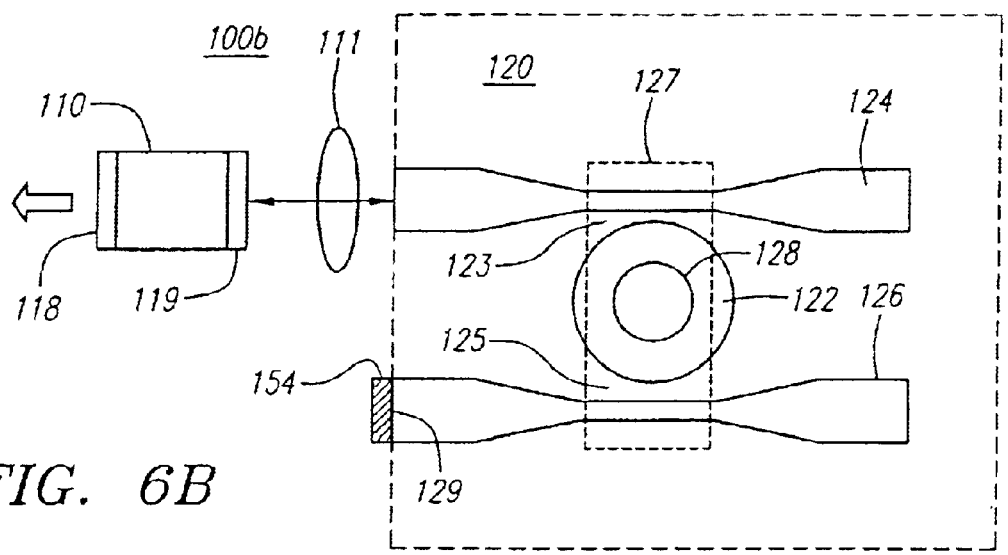
FIG. 6B is a schematic view of an alternative to the first embodiment of the tunable laser of the present invention shown in FIG. 6A.

The collimated lens 152 right after the end facet 129 of the second waveguide 126 converts the output of the second waveguide 126 into parallel light beams. The mirror 150 reflects the light or optical power back into the second waveguide 126. Alternatively, as shown in FIG. 6B, the light may be reflected back into the system by a high reflection (H.R.) coating 154 applied to the end facet 129 of the second waveguide 126. The use of a H.R. coating advantageously eliminates the need for additional optical elements such as a mirror and lens.

The reflected light or optical power propagates back through the waveguide-coupled resonator 120, i.e., the reflected light propagates through the second waveguide 126 to the interaction area 127 where it is coupled into the resonator 122 and, as it propagates within the resonator 122, it is coupled into the first waveguide 124 at the interaction area 127. From the first waveguide 124, the light is coupled back into the laser diode 110. Thus, a closed optical cavity is formed between the laser diode 110 and the waveguide-coupled optical resonator 120.

By increasing the current injected into the laser diode 110 until the light associated with the particular resonance frequency selected by the optical resonator 122 has enough gain to compensate or overcome the optical losses encountered during the light's propagation through the closed cavity, the light becomes lasing and is output from the other end facet 118 of the laser diode 110. Further increases of the current injected into the laser diode 110 will increase the lasing output power of the tunable laser system 100a and 100b of the present invention. The level of the injected current, however, remains below the lasing threshold for the laser diode, but above the lasing threshold of the tunable laser system.

In order to tune the lasing frequency of the tunable laser system 100a and 100b, voltage or current may be applied to the optical resonator 122. As discussed in detail below, the applied voltage or current changes the refractive index of the material in the resonator 122 due to electro-optical effects or carrier effects, which in turn changes the resonance frequency of the resonator 122. Changing the resonance frequency of the resonator 122, changes the lasing frequency (wavelength) of the tunable laser system 100a and 100b.

Advantageously, the lasing frequency (wavelength) may be continuously changed or tuned by continuously changing the voltage or current applied to the resonator 122. Tuning speeds tend to be on the order of nanoseconds (e.g., 1–100 ns) or faster as a result.

The waveguide-coupled resonator 120 along with the mirror 150 or H.R. coating 154 provide an effective reflection for the laser diode 110 that is similar to the reflection provided by the end facets of a conventional laser diode in typical use, and may be equivalent to an effective facet mirror. If $P_i$ is the power of the light coupled into the waveguide-coupled resonator 120 and mirror 150 system, $P_o$ is the output power of the light after being reflected by the system. Effective reflectivity is defined as $$R_{\it eff} = \frac{P_o}{P_i} \quad (5)$$

Preferably, effective reflectivity $R_{\it eff}$ of the system is comparable to the effective reflectivity at the end facets of a conventional laser diode, which is typically about 30%. However, effective reflectivity $R_{\it eff}$ is dependent upon how much power can be transferred between the two waveguides 124 and 126 of the system, assuming that the light can be fully reflected back into the system. In an ideal case, the three conditions for full power transfer mentioned above are satisfied. In reality, however, any fabrication error or material defect may cause the coupling between the waveguides 124 and 126 and the resonator 122 to be imbalanced and may introduce optical loss into the system.

Figure 7:
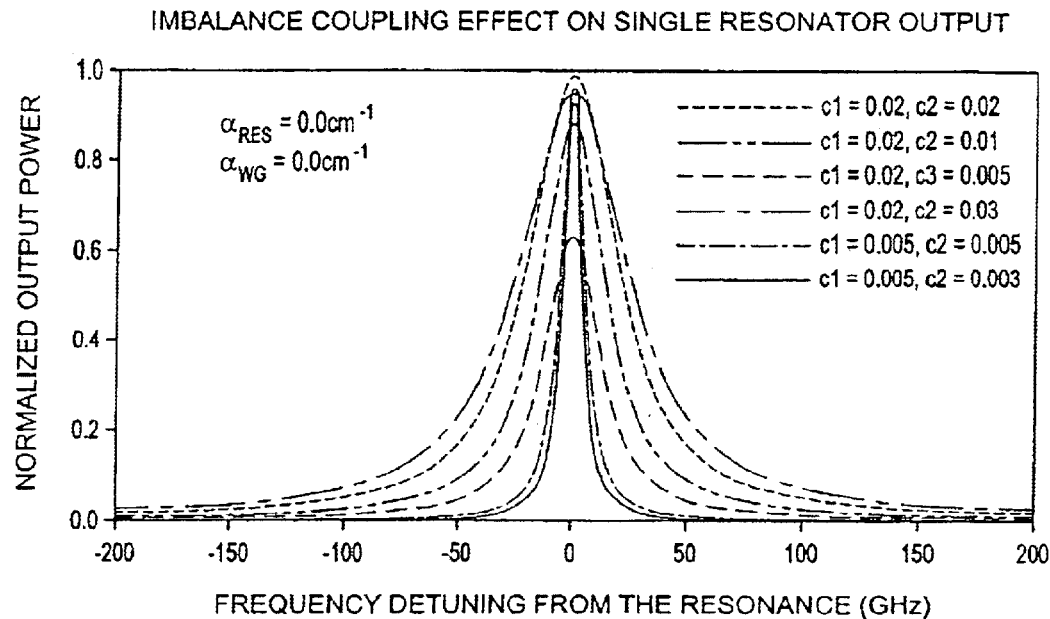
FIG. 7 is a graph showing the effect of imbalanced coupling on the output power of a lossless waveguide-coupled resonator system having a single optical resonator.

Assuming that there is no optical loss in the waveguides 124 and 126 and the resonator 122, $R_{\it eff}=1$ tends to be unachievable when the coupling on each side is not balanced, i.e., c1≠c2, where c1 and c2 are the coupling coefficients between the resonator 122 and waveguides 124 and 126 across the coupling gaps 123 and 125. This effect is illustrated in FIG. 7, As depicted in FIG. 7, 100% power transfer tends to occur when c1≠c2, but not when c1≠c2. Furthermore, the larger the imbalance, the lower the percentage of power transferred. For example, if c1=0.02, c2=0.005, then there is only about 60% power transferred even with no optical loss in the system. For all cases shown in FIG. 7, the radius of the resonator 122 is 5 μm, the coupling waveguides 124 and 126 are tapered down to about 0.5 μm adjacent the coupling or interaction region 127, and the refractive index for the resonator 122 and waveguides 124 and 126 is 3.4.

Figure 8:
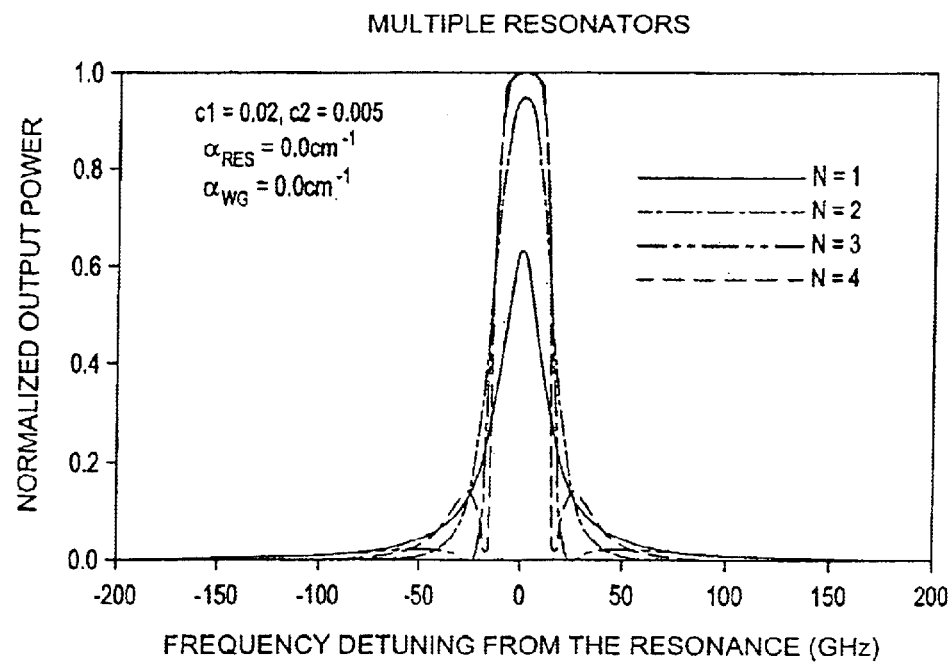
FIG. 8 is a graph showing the improvement in output power result from the use of multiple resonators in a lossless waveguide-coupled resonator system having imbalanced coupling.

As shown in FIG. 8, the use of multiple resonators instead of a single resonator tends to improve system performance. FIG. 8 shows the results for lossless systems with imbalanced coupling, i.e., c1=0.02, c2=0.005, and different numbers of resonators (N), with all other parameters remaining the same as for the single resonator case depicted in FIG. 7. When N=1, the percentage of power transferred is about 60%. When N=2, the percentage of power transferred increases to about 95%, assuming in this case a distance between two adjacent resonators of preferably about 24 μm, which ensures constructive interference between the resonators. The preferred distance between resonators to ensure constructive interference may be determined by calculating the phase difference between the two adjacent resonators, which should be equal to 2 mπ, m=0,1,2, . . . , where m is an integer. When N=4, power transfer approaches 100%. This is not surprising if the system is thought of as a grating. The more resonators, the higher the order of the grating. The improvement of the performance of the system as the number of resonators is increased is mainly due to the constructive interference among the resonators. This can be verified by the change in the response spectrum shape, which has a much flatter passband and a faster rolloff.

Figure 9:
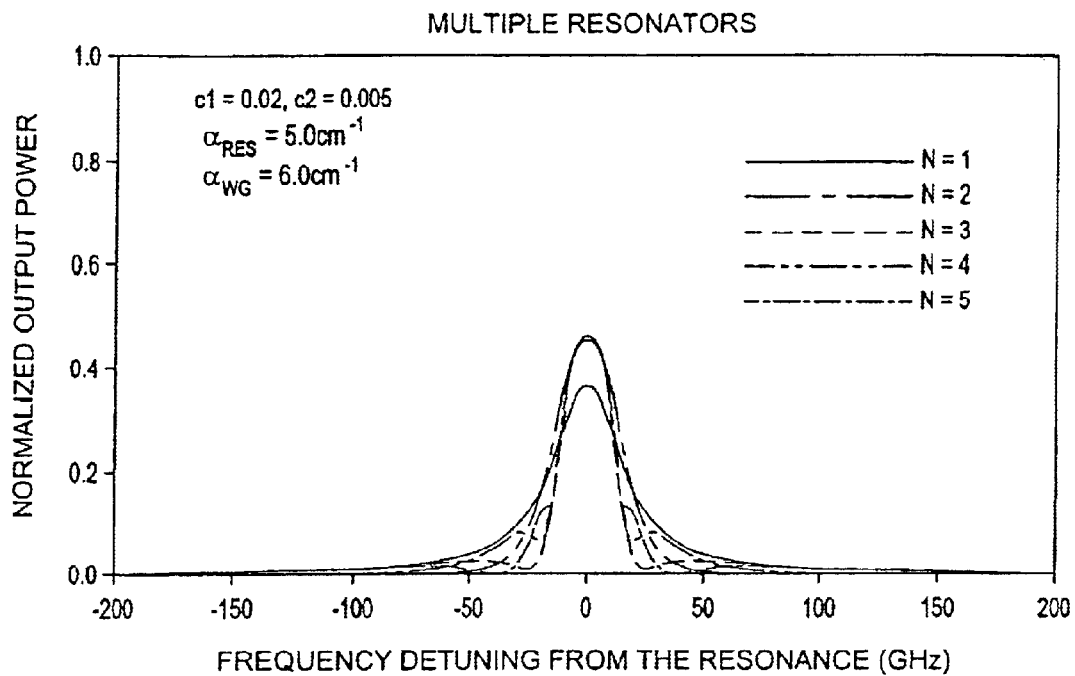
FIG. 9 is a graph showing the output power of a waveguide-coupled resonator system with optical losses and imbalanced coupling for different numbers of optical resonator, wherein the loss coefficient is 6.0 cm$^{-1}$ in the waveguide and 5.0 cm$^{-1}$ in the resonator.

In reality, however, such a system would include optical losses. The percentage of power transferred for a system similar to the system depicted in FIG. 8, except that loss coefficients in the resonators of $\alpha_{RES}$=5.0 cm$^{-1}$ and in the coupling waveguides of $\alpha_{WG}$=6.0 cm$^{-1}$ are assumed, is shown if FIG. 9. As shown, the percentage of power transferred for a single resonator drops to about 38%. The use of two resonators, however, improves the percentage of power transferred to about 50%. A further increase in the number of resonators, however, does not tend to significantly improve the percentage of power transferred. For example, where N=3,4,5, the percentage of power transferred is very close to that of N=2. The lack of improvement in power transfer due to the use of multiple resonators is because the beneficial effect of the multiple resonators tends to be offset by an increase in optical loss due to the existence of more resonators.

Figure 10:
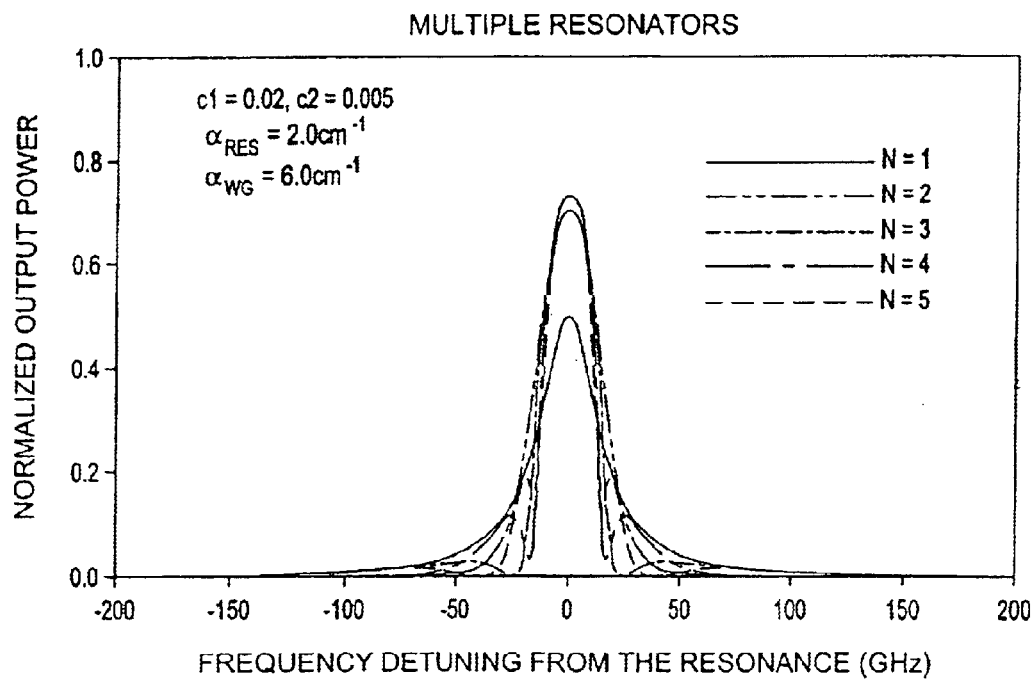
FIG. 10 is a graph showing the output power of a lossy waveguide-coupled resonator system with imbalanced coupling for different numbers of optical resonator, wherein the loss coefficient in the waveguide is 6.0 cm$^{-1}$ and 2.0 cm$^{-1}$ in the resonator.

In order to fully utilize the beneficial effect that multiple resonators may have on the percentage of power transfer, the optical loss due to the resonators is preferably minimized. The percentage of power transferred for a system similar to the system depicted in FIG. 9, except that the loss coefficient in the resonators is decreased to 2.0 cm$^{-1}$, is shown if FIG. 10. With a lower loss coefficient for the resonator, the percentage of power transferred in a single resonator system tends to be about 50%. The percentage of power transferred tends to increase to about 70% for N=2 and 75% for N=3, 4 and 5. Compared to FIG. 9, the improvement is significant. Therefore, having low loss resonators in the system is very advantageous in that it results in high reflectivity for the laser diode. However, as the results for N=3, 4 and 5 indicate, it is not necessary to have as many resonators as possible. As FIGS. 9 and 10 indicate, two (N=2) resonators tends to be enough to sufficiently improve the percentage of power transfer in a system. As a result, a tunable laser device of the present invention may advantageously be very compact.

Figure 11:
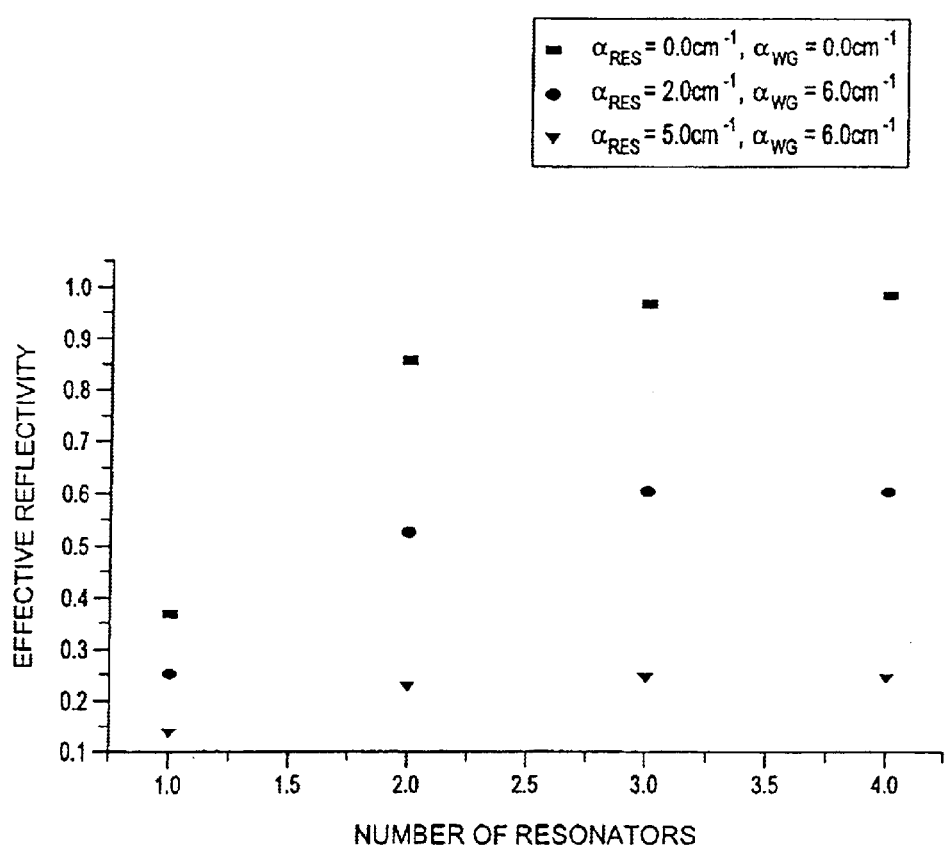
FIG. 11 is a graph showing effective reflectivity as a function of the number of resonators in a waveguide-coupled resonator system with imbalanced coupling and different optical loss coefficients.

Turning to FIG. 11, effective reflectivity is shown as a function of the number of resonators in a system with imbalanced coupling and different optical loss coefficients. As FIG. 11 indicates, when N>3 the change in effective reflectivity is minimal. In order to have an effective reflectivity $R_{\it eff}$ of about 30% or higher, it is preferable that the loss coefficient in the resonator(s) is less than about 3 cm$^{-1}$, which mainly depends on the fabrication processes.

Referring to FIGS. 12A and 12B, additional illustrative embodiments of the tunable laser 101a and 101b of the present invention are shown to include multiple resonators $122_i$, $122_{ii}$, and $122_{iii}$ instead of a single resonator. With the exception of multiple resonators $122_i$, $122_{ii}$, and $122_{iii}$, the structure of these tunable lasers 101a and 101b correspond to the structure of the tunable lasers 100a and 100b shown in FIGS. 6A and 6B with like elements identified with the same element numerals. Electrode contacts $128_i$, $128_{ii}$, and $128_{iii}$, are shown positioned on top of the resonators $122_i$, $122_{ii}$, and $122_{iii}$. A second set of electrode contacts (not shown) are positioned below the resonators $122_i$, $122_{ii}$, and $122_{iii}$ as shown in FIG. 2B. Although FIGS. 12A and 12B show tunable lasers 101a and 101b utilizing three resonators $122_i$, $122_{ii}$, and $122_{iii}$, one skilled in the art would understand that a tunable laser of the present invention may comprise two or more than three resonators. However, according to the analysis presented above in regard to FIGS. 9, 10 and 11, two or three resonators may be sufficient to improve the percentage of power transferred to a desirable level.

As noted above, wavelength tuning is realized in the tunable lasers of the present invention by changing the resonance wavelength, i.e., frequency, of the optical resonator. There are basically two main alternative methods of electrically changing the refractive index of a semiconductor, of which the optical resonator of the present invention is composed, which results in a change in resonance frequency of the resonator. The first method utilizes the electro-optic effects that result when a voltage is applied to the resonator. The second method utilizes the carrier effects resulting from injecting current into the resonator. These effects are described below in regard to a typical wafer structure for an optical resonator 160 of the present invention shown in FIG. 13A.

Figure 13A:
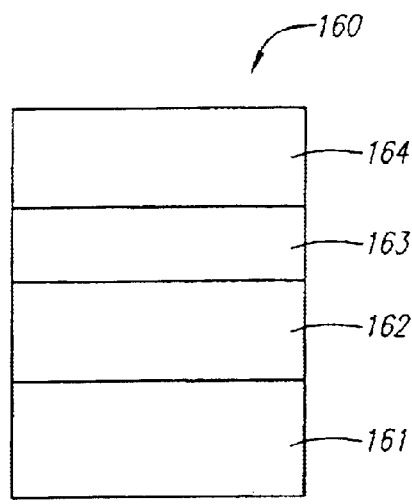
FIG. 13A is a schematic view of a typical pin wafer structure for an optical resonator of the present invention based on an InGaAsP/InP material system.
Figure 13B:
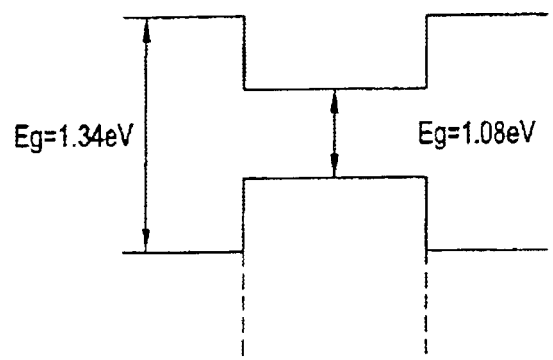
FIG. 13B is a graphical representation of the energy bandgap of the pin wafer structure shown in FIG. 13A.
Figure 13C:
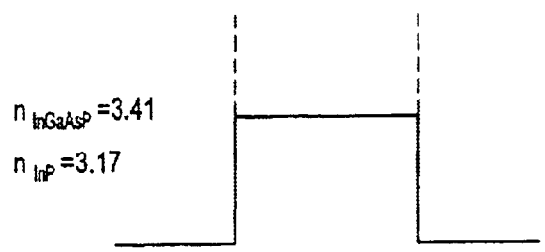
FIG. 13C is a graphical representation of the refractive index profile of the pin wafer structure shown in FIG. 13A.

The wafer structure of the optical resonator 160 shown in FIG. 13A is basically the same as the wafer structure of the semiconductor laser diode 10 shown in FIG. 1A, which provides the possibility for monolithic integration of the components of the tunable laser system of resent invention. The structure preferably includes a first cladding layer 162, which is preferably formed from highly n-doped InP material, a second cladding layer 164, which is preferably formed from highly p-doped InP material, and a core or guiding layer 163, which is preferably formed from non-doped InGaAsP material, sandwiched between the two cladding layers 162 and 164. There monolithic integration is unnecessary, the resonator core may be formed from other materials such as GaAs/AlGaAs, SiOxSi, polymers, and the like. All of the layers are formed on top of a substrate 161, which is preferably formed from more highly n-doped InP material. The cladding layers 162 and 164 are preferably about 1.0 μm thick, while the guiding layer 163 is preferably about 0.4 μm thick. FIGS. 13B and 13C illustrate the energy bandgap structure and the refractive index distribution, respectively, for the pin structure shown in FIG. 13A.

Basically, both applying voltage and injecting current will induce a change in the effective refractive index of the optical resonator 160, which in turn changes the resonance spectrum of the resonator 160. In the resonator 160 of the present invention, whispering-gallery modes (WGMs) dominate. These WGMs usually have high Q values which are given by equation (3). The change in refractive index needed for a half resonance linewidth shift of $\delta\lambda/2$ may be estimated as follows. The resonance wavelength of $\lambda_1$ may be approximated from $$\frac{2\pi L_c}{\lambda_1} n = 2m\pi \qquad (6a)$$

which, for a refractive index change of $\Delta n$, becomes $$\frac{2\pi L_c}{\lambda_1 + \delta\lambda/2}(n + \Delta n) = 2m\pi \qquad (6b)$$

where LC is the circumference of the microdisk resonator, n is the effective refractive index, and m is the azimuthal index which describes the mode distribution along the disk circumference. Combining equations (6a) and (6b) and solving for $\Delta n$, the resulting equation becomes $$\Delta n = m\lambda_1/(2L_c Q) \qquad (7)$$

Assuming a 10 μm-diameter microdisk resonator, where m=60, $\lambda_1$=1.55 μm, $L_c$=πd≈31.4 μm, and Q≈200, then from equation (7) $\Delta n$=7.4×10$^{-3}$. This refractive index change enables a shift of the resonance wavelength of about $\delta\lambda/2$≈3.8 nm. However, as discussed above such a small Q value is undesirable because the losses associated with the optical resonator would be too large. Preferably, the resonators of the present invention have high Q values, which, as noted in the analysis above, advantageously results in a system having high effective reflectivity (see FIGS. 9, 10 and 11). Assuming Q≈5000, from equation (7), $\Delta n$=2.96×10$^{-4}$. Such a change in refractive index causes a resonance shift of $\delta\lambda/2=\lambda_r/(2Q)$=0.16 nm.

The tuning range of the resonator, however, is determined by the free spectral range (FSR), i.e., $\Delta\lambda$. The FSR of a 10 μm-diameter microdisk is about 20 nm and should satisfy the following equation $$\frac{2\pi L_c}{\lambda_1 + \Delta\lambda} n = 2m\pi - 2\pi \qquad (8)$$

which, for a shift of the resonance by $\Delta\lambda$, becomes $$\frac{2\pi L_c}{\lambda_1 + \Delta\lambda}(n + \Delta n) = 2m\pi \qquad (9)$$

Combining equation (8) and equation (9) and solving for $\Delta n$, results in $$\Delta n = \frac{\lambda_1 + \Delta\lambda}{L_c} = 0.05 \qquad (10)$$

$\Delta n$ is positive because a red shift of resonance is assumed. The carrier effects and electro-optic effects are calculated as follows to estimate how much current or voltage is needed for such a change in refractive index.

Figure 14:
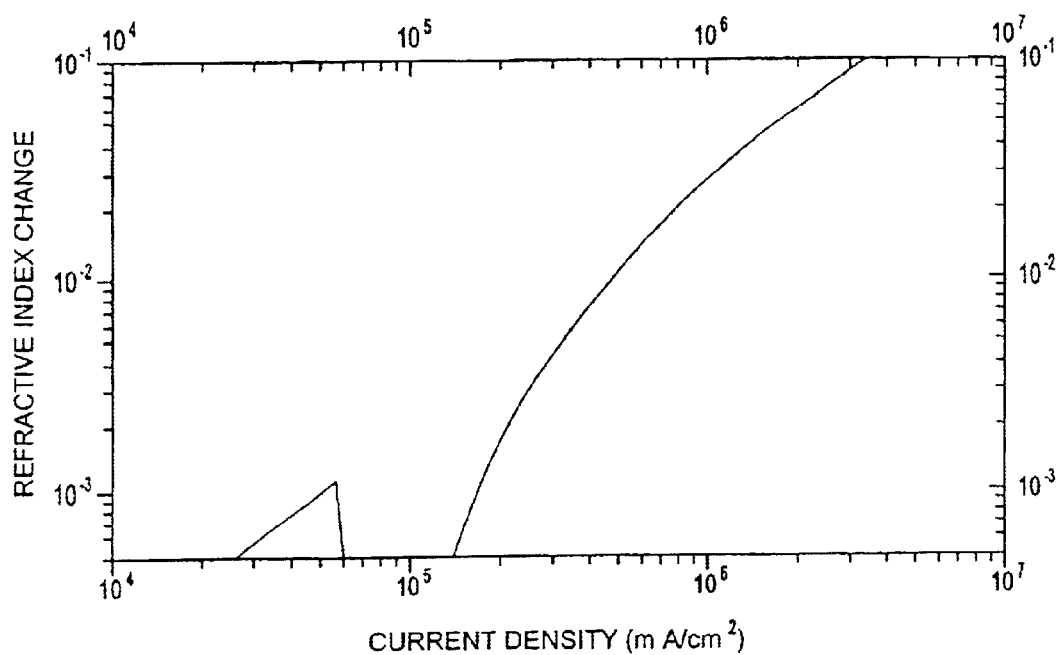
FIG. 14 is a graph showing changes in refractive index due to the carrier effects as a function of injected current and current density for a 10 $\mu$m diameter resonator based on the pin wafer structure shown in FIG. 13A and a working wavelength of 1.55 μm.

There are basically three carrier effects that are responsible for the refractive index change, i.e., band filling, bandgap shinkage and free carrier absorption. FIG. 14 shows refractive index change $\Delta n$ as functions of injected current density and injected current for a 10 μm-diameter microdisk resonator with a wafer structure as described in FIG. 13A while considering all the carrier-induced effects, i.e., band-filling, bandgap shrinkage and free carrier absorption. For a carrier concentration of less than 1016, bandgap shrinkage effect can be neglected as the interparticle spacing is too large (i.e., $\chi<\chi_{cr}$, where $\chi$ is the carrier concentration) and bandfilling dominates, which yields a negative $\Delta n$. However, bandgap shrinkage effect becomes important over the range $10^{16}<\chi<10^{17}$ and approximately cancels the bandfilling and free carrier absorption effects. For higher carrier concentration, bandfilling and free carrier absorption effects dominate and give a large negative $\Delta n$. From FIG. 14, in order to achieve a refractive index change of 0.05, a 1.8×10$^6$ mA/cm$^2$ current density or 1.33 mA current for the 10 μm-diameter microdisk resonator is needed. Note that in the calculations the injected carrier density is obtained by $$J = \frac{qdN}{\tau} \qquad (11)$$

where τ≈1 ns is the carrier lifetime, q is electron charge, N is the carrier concentration and d=0.4 μm is the microdisk core thickness. From FIG. 14, for a refractive index change up to 10$^{-1}$, a current density of only about 3.4×10$^6$ mA/cm$^2$ is needed. Since the size of microdisk resonators could be a few microns, the driving current will be about a few mAs. Such a small driving current is one of the advantages of the tunable lasers of the present invention.

Figure 15:
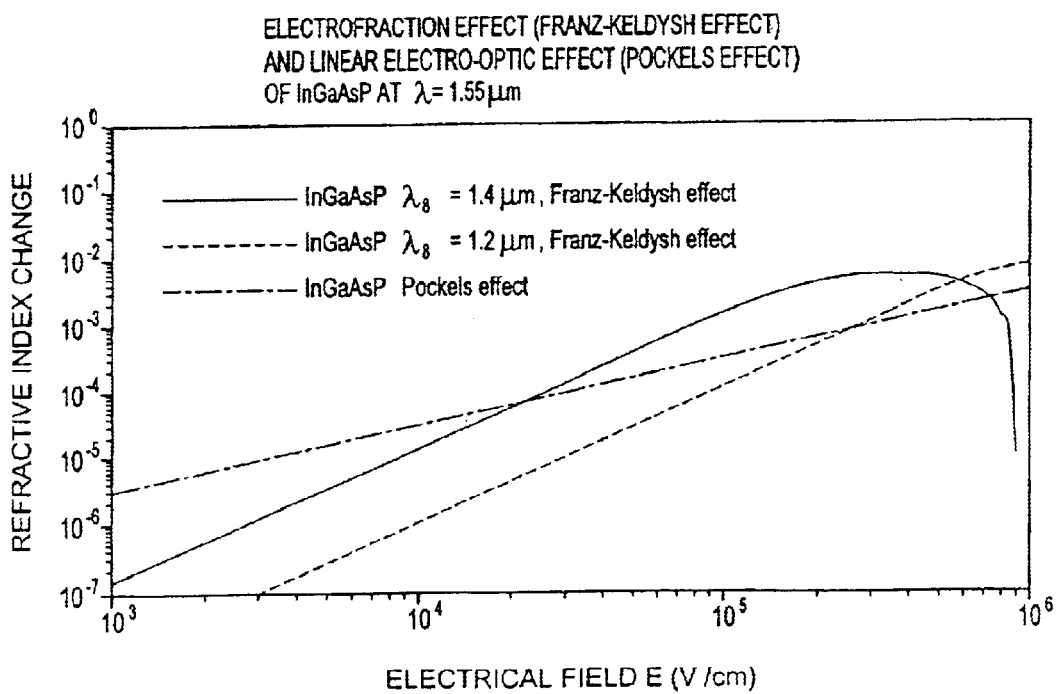
FIG. 15 is a graph showing changes in refractive index changes due to Pockels and Franz-Kedysh effects as a function of an electrical field due to an applied reversed bias voltage for a 10 micron diameter resonator based on the pin wafer structure shown in FIG. 13A and a working wavelength of 1.5 μm.

When a reversed bias voltage is applied to the pin junctions, there will be an electrical field across the non-doped region. Two major electro-optic effects associated with this electrical field will change the refractive index of the material: (1) Linear electro-optic (Pockels) effect; and (2) Electrorefractive (Franz-Keldysh) effect. The Pockel effect is polarization dependent and dominates at relatively low electrical field intensity. The Franz-Keldysh effect will have the major contribution when the working wavelength is very close to the bandgap and at relatively high electrical field. With the wafer structure described in FIG. 13, the refractive index change caused by the two effects is shown in FIG. 15. From FIG. 15, the Pockel effect tends to be larger than the Franz-Keldysh effect when the electrical field $E<2\times10^4$ V/cm. However, the Franz-Keldysh effect tends to begin to dominate at higher field, but will decrease if the field continues to increase. In order to have a refractive index change on the order of 0.01, the required electrical field tends to be about $10^6$ V/cm. If the thickness of the non-doped layer is 0.4 $\mu$m, the required voltage tends to be about 40V (assuming the voltages dropped across the highly doped layers and the interface between the electrode and the contact layers (Ohmic contact) are relatively negligible.) Compared with the carrier effects, the electro-optic effects tend to be less efficient.

Figure 16A:
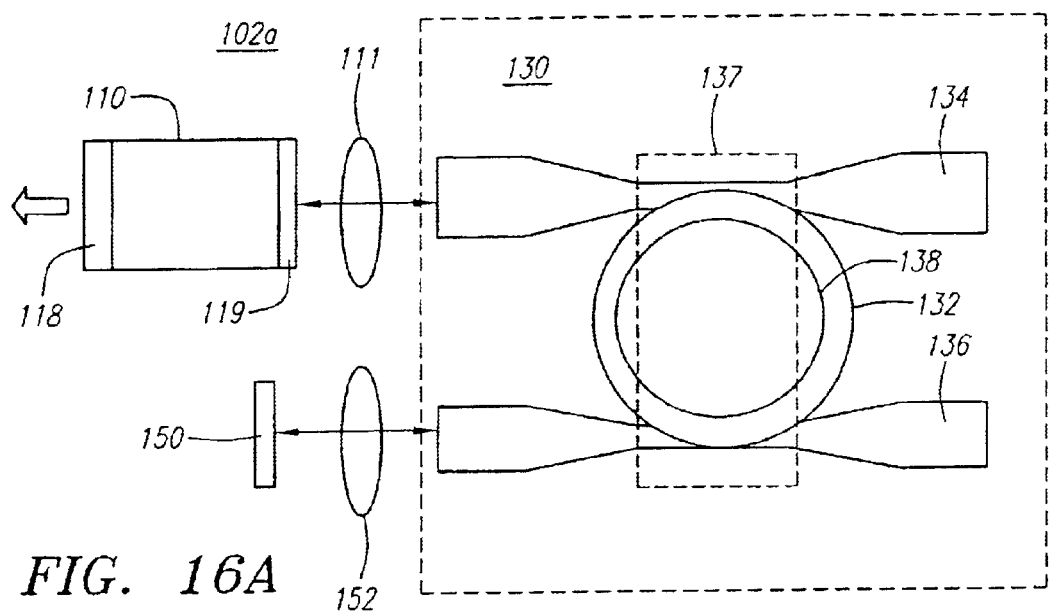
FIG. 16A is a schematic view of a third embodiment of a tunable laser of the present invention similar to that shown in FIG. 6A except the waveguides are vertically coupled to the optical resonator.
Figure 16B:
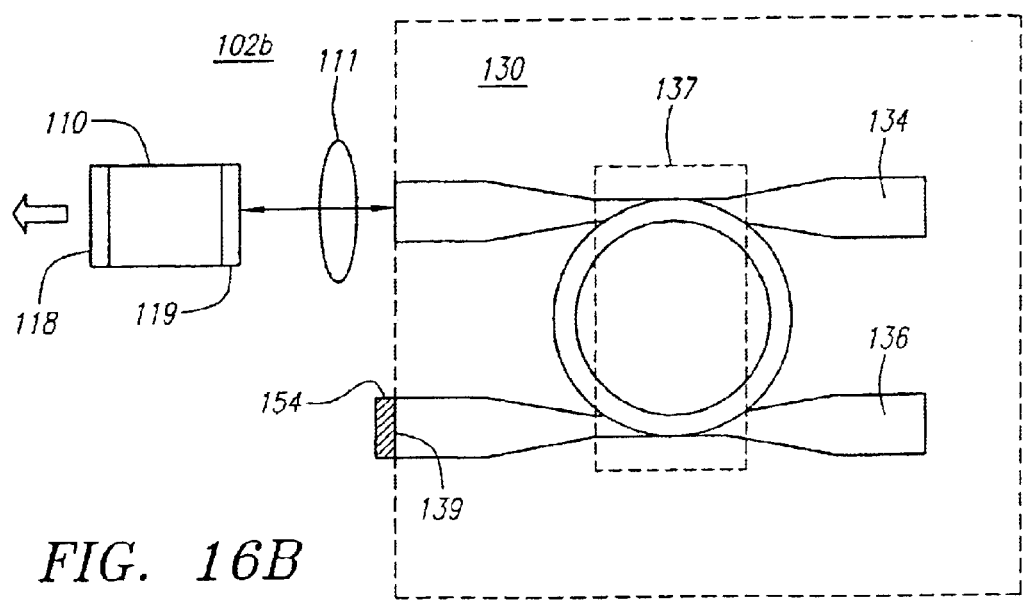
FIG. 16B is a schematic view of an alternative to the third embodiment of a tunable laser of the present invention shown in FIG. 16A and similar to that shown in FIG. 6B except the waveguides are vertically coupled to the optical resonator.

The foregoing description of the present invention has illustrated the details of a wavelength tunable laser by combining a semiconductor laser diode and tunable waveguide-coupled optical resonators as the closed wavelength selective external cavity. It will be appreciated by those of skill in the art that the waveguides of the tunable waveguide-coupled optical resonators of the present invention can be coupled to the optical resonator either horizontally (see FIGS. 6A, 6B, 12A and 12B) or vertically. FIGS. 16A and 16B, for example, illustrate other embodiments 102a and 102b of the tunable laser of the present invention that are very similar to the tunable lasers 100a and 100b shown in FIGS. 6A and 6B, respectively, with the exception of the waveguides 134 and 136 being vertically, instead of horizontally, coupled to the resonator 132. More particularly, the tunable lasers 102a and 102b of the present invention include a semiconductor laser diode 110, with opposing end facets 118 and 119, optically coupled through a high N.A. coupling lens 111 to a waveguide-coupled resonator 130. The laser diode 110 has substantially the same structure as the laser diode 10 shown in FIG. 1 with the exception of the end facet 119 that is adjacent the waveguide-coupled optical resonator 130 being coated with an A.R. coating. The waveguide-coupled resonator 130, which has substantially the same structure as the waveguide-coupled resonator 30 shown in FIGS. 3A and 3B, includes a circular or disk-shaped resonator cavity 132 with an electrode contact 138 deposited on top of the resonator 132. An additional electrode contact (not shown) may be deposited below the resonator 132 as shown in FIG. 3B. The resonator 132 is positioned above the first and second waveguides 134 and 136 and separated therefrom by a separation layer. The waveguides 134 and 136, which preferably include a tapered structure, are positioned in parallel orientation in the same layer. The tunable laser 102a further includes a collimated lens 152 and a mirror 150, positioned adjacent to an end facet 139 of the second waveguide 136 or, alternatively, as shown in FIG. 16B, the tunable laser 102b includes a H.R. coating 154 applied to the end facet 139 of the second waveguide 136.

In operation, current is applied to the laser diode 110 at a level below the lasing threshold of the laser diode 110 to generate spontaneous light emissions from the A.R. coated end facet 119 of the laser diode 110. The light emissions are coupled into the first waveguide 134 of the waveguide-coupled resonator 130 through the coupling lens 111. The light propagates through the first waveguide 134 and reaches the interaction area 137 of the first waveguide 134 and the resonator 132. Light having a wavelength associated with a resonance frequency of the resonator 132 is vertically coupled into the resonator 132 through evanescent coupling across the separation layer. As the light propagates within the resonator 132, the light is vertically coupled into the second waveguide 136 through evanescent coupling across the separation layer at the interaction area 137 of the second waveguide 136 and the resonator 132. Thus, a certain portion of the input optical power from the laser diode 110 is transferred from the first coupling waveguide 134 to the second coupling waveguide 136.

In the tunable laser 102a shown in FIG. 16A, the collimated lens 152 right after the end facet 139 of the second waveguide 136 converts the output of the second waveguide 136 into parallel light beams. The mirror 150 reflects the light or optical power back into the second waveguide 136. In the tunable laser 102b shown in FIG. 16B, the HR coating 154 on the end facet 139 of the second waveguide 136 reflects the light or optical power back into the second waveguide 136. The reflected light or optical power propagates back through the waveguide-coupled resonator 130, i.e., the reflected light propagates through the second waveguide 136 to the interaction area 137 where it is coupled into the resonator 132 and, as it propagates within the resonator 132, it is coupled into the first waveguide 134 at the interaction area 137. From the first waveguide 134, the light is coupled back into the laser diode 110. Thus, a closed optical cavity is formed between the laser diode 110 and the waveguide-coupled optical resonator 130. Lasing and tuning of the lasing wavelength are accomplished as discussed above.

Referring to FIGS. 18A and 18B, additional illustrative embodiments 104a and 104b of the tunable laser of the present invention are shown to include multiple resonators $132_i$, $132_{ii}$, and $132_{iii}$, instead of a single resonator. With the exception of multiple resonators $132_i$, $132_{ii}$, and $132_{iii}$, the structure of the tunable lasers 104a and 104b correspond to the structure of the tunable lasers 102a and 102b shown in FIGS. 16A and 16B with like elements identified with the same element numeral. Electrode contacts $138_i$, $138_{ii}$, and $138_{iii}$ are shown positioned on top of the resonators $132_i$, $132_{ii}$, and $132_{iii}$. A second set of electrical contacts (not shown) are positioned below the resonators $132_i$, $132_{ii}$, and $132_{iii}$ as shown in FIG. 3B.

The tunable lasers 102a, 102b, 104a and 104b, as depicted in FIGS. 16A, 16B, 18A and 18B, respectively, include coupling waveguides that are formed in the same layer of the device. Those of skill in the art will appreciate that the coupling waveguides may be formed in different layers as shown in FIGS. 17A, 17B, 19A and FIG. 19B.

Figure 17A:
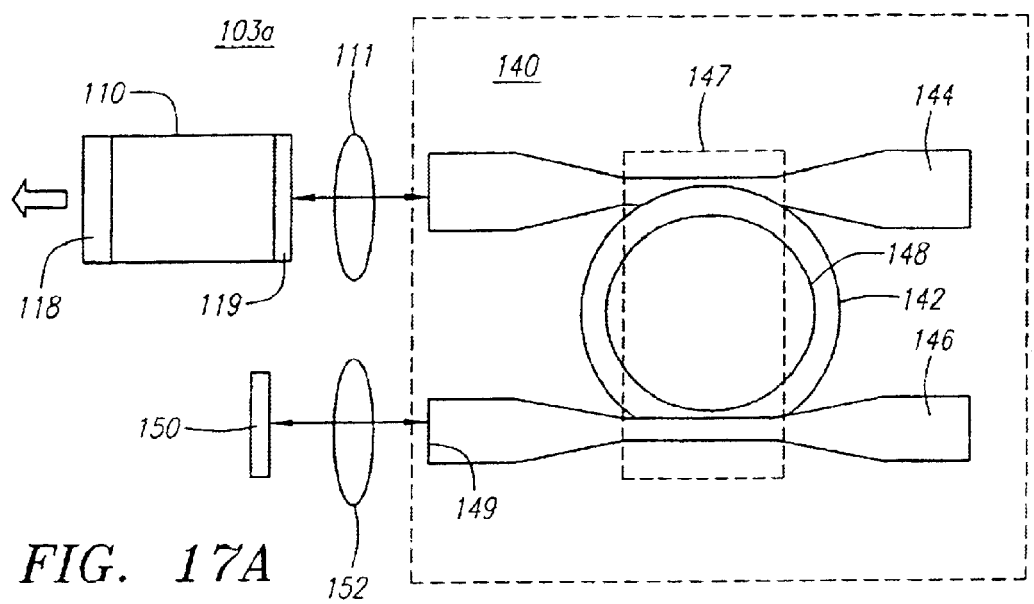
FIG. 17A is a schematic view of a fourth embodiment of a tunable laser of the present invention similar to that shown in FIG. 16A except the waveguides, which are vertically coupled to the optical resonator, are positioned above and below the resonator.
Figure 17B:
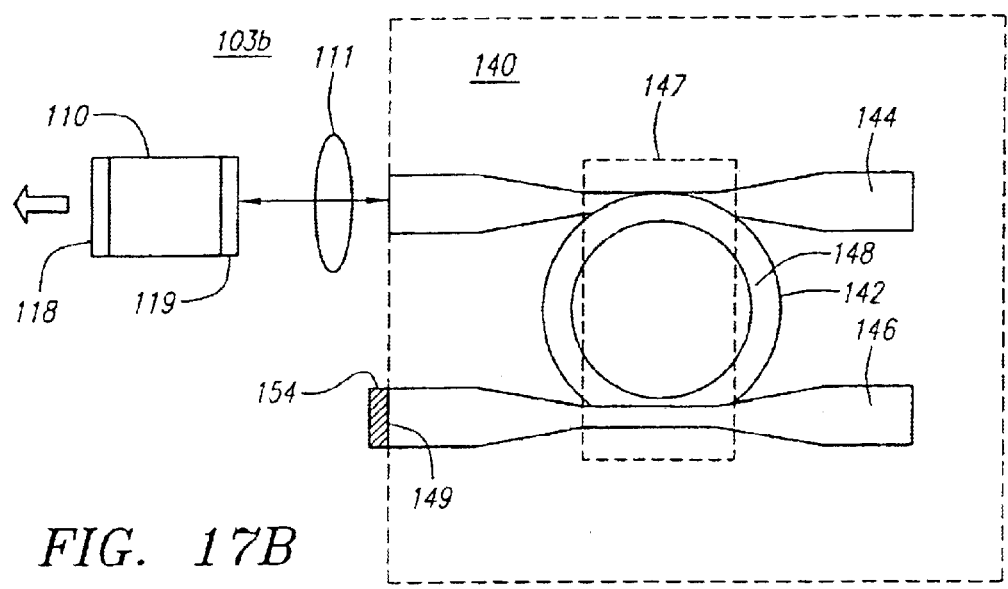
FIG. 17B is a schematic view of an alternative to the fourth embodiment of a tunable laser of the present invention shown in FIG. 17A and similar to that shown in FIG. 16B except the waveguides, which are vertically coupled to the optical resonator, positioned above and below the resonator.

Referring to FIGS. 17A and 17B, the tunable lasers 103a and 103b of the present invention are shown to include a semiconductor laser diode 110, with opposing end facets 118 and 119, optically coupled through a high N.A. coupling lens 111 to a waveguide-coupled resonator 140. The laser diode 110 has substantially the same structure as the laser diode 10 shown in FIG. 1 with the exception of the end facet 119 that is adjacent the waveguide-coupled optical resonator 140 being coated with an A.R. coating. The waveguide-coupled resonator 140, which has substantially the same structure as the waveguide-coupled resonator 40 shown in FIGS. 4A and 4B, includes a circular or disk-shaped resonator cavity 142 with an electrode contact 148 shown positioned on top of the resonator 142. An additional electrode contact (not shown) may be positioned below the resonator 142 as shown in FIG. 4B. The resonator 142 is positioned above the first waveguide 144 and below the second waveguide 146 and separated therefrom by separation layers. The waveguides 144 and 146, which preferably include a tapered structure, are positioned in parallel orientation in different layers. The tunable laser, as shown in FIG. 17A, further includes a collimated lens 152 and a mirror 150, positioned adjacent to an end facet 149 of the second waveguide 146 or, alternatively, as shown in FIG. 17B, a H.R. coating 154 applied to the end facet 149 of the second waveguide 146.

In operation, current is applied to the laser diode 110 at a level below the lasing threshold of the laser diode 110 to generate spontaneous light emissions from the A.R. coated end facet 119 of the laser diode 110. The light emissions are coupled into the first waveguide 144 of the waveguide-coupled resonator 140 through the coupling lens 111. The light propagates through the first waveguide 144 and reaches the interaction area 147 of the first waveguide 144 and the resonator 142. Light having a wavelength associated with a resonance frequency of the resonator 142 is vertically coupled into the resonator 142 through evanescent coupling across the first separation layer. As the light propagates within the resonator 142, the light is vertically coupled into the second waveguide 146 through evanescent coupling across the second separation layer at the interaction area 147 of the second waveguide 146 and the resonator 142. Thus, a certain portion of the input optical power from the laser diode 110 is transferred from the first coupling waveguide 144 to the second coupling waveguide 146.

In the tunable laser 103*a* shown in FIG. 17A, the collimated lens 152 right after the end facet 149 of the second waveguide 146 converts the output of the second waveguide 146 into parallel light beams. The mirror 150 reflects the light or optical power back into the second waveguide 146. In the tunable laser 103*b* shown in FIG. 17B, the H.R. coating 154 on the end facet 149 of the second waveguide 146 reflects the light or optical power back into the second waveguide 146. The reflected light or optical power propagates back through the waveguide-coupled resonator 140, i.e., the reflected light propagates through the second waveguide 146 to the interaction area 147 where it is coupled into the resonator 142 and, as it propagates within the resonator 142, it is coupled into the first waveguide 144 at the interaction area 147. From the first waveguide 144, the light is coupled back into the laser diode 110. Thus, a closed optical cavity is formed between the laser diode 110 and the waveguide-coupled optical resonator 140. Lasing and tuning of the lasing wavelength are accomplished as discussed above.

Figure 19A:
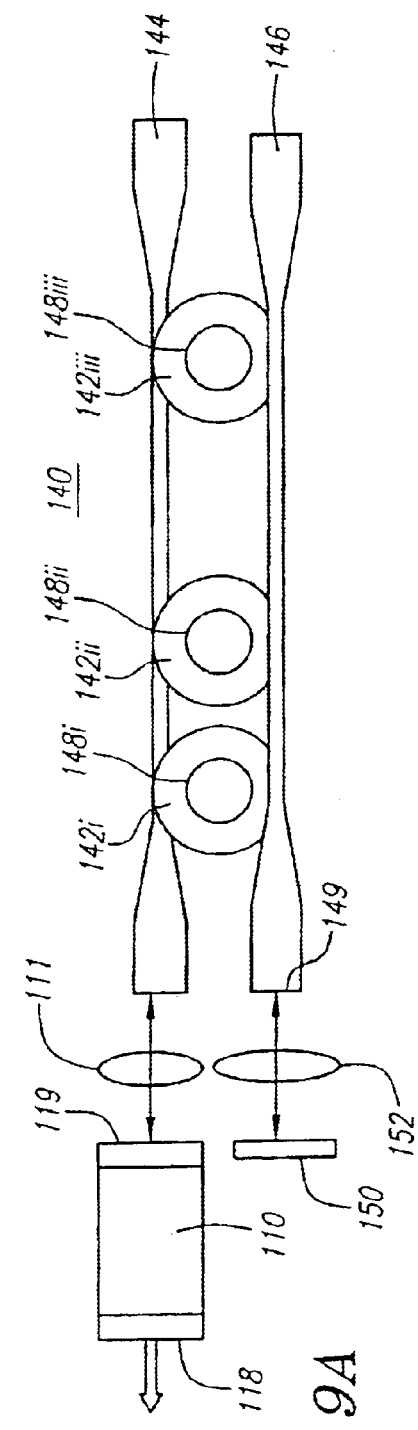
FIG. 19A is a schematic view of a sixth embodiment of a tunable laser of the present invention similar to that shown in FIG. 17A except for the use of multiple optical resonators.
Figure 19B:
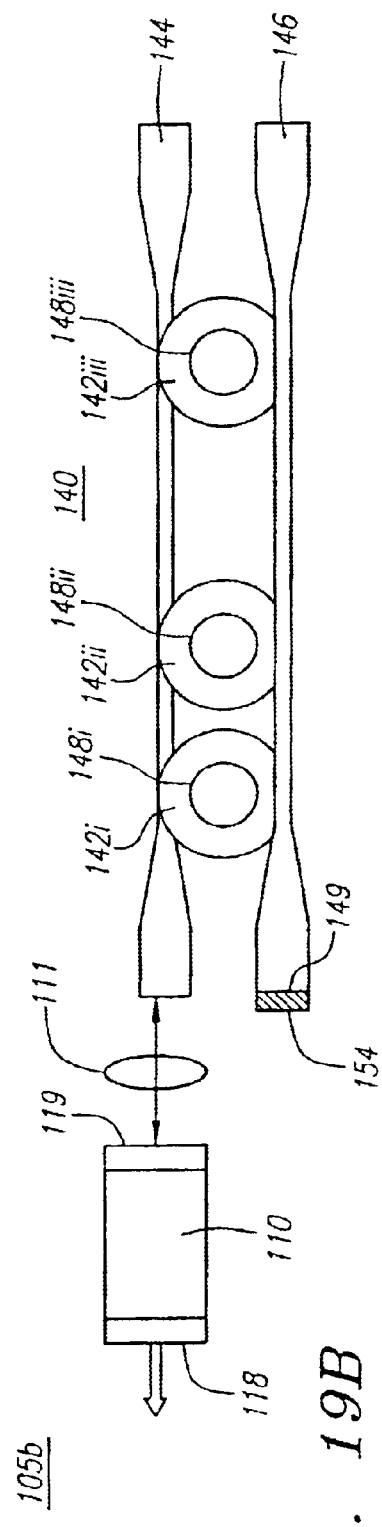
FIG. 19B is a schematic view of an alternative to the sixth embodiment of a tunable laser of the present invention shown in FIG. 19A and similar to that shown in FIG. 17B except for the use multiple optical resonators.

Referring to FIGS. 19A and 19B, additional illustrative embodiments 105*a* and 105*b* of the tunable laser of the present invention are shown to include multiple resonators 142$_i$, 142$_{ii}$, and 142$_{iii}$ instead of a single resonator. With the exception of multiple resonators 142$_i$, 142$_{ii}$, and 142$_{iii}$, the structure of these tunable lasers 105*a* and 105*b* correspond to the structure of the tunable lasers 103*a* and 103*b* shown in FIGS. 17A and 17B with like elements identified with the same element numeral. Electrode contacts 148$_i$, 148$_{ii}$, and 148$_{iii}$ are shown positioned on top of the resonators 142$_i$, 142$_{ii}$, and 142$_{iii}$. A second set of electrode contacts (not shown) are positioned below the resonators 142$_i$, 142$_{ii}$, and 142$_{iii}$ as shown in FIG. 4B.

Figure 20A:
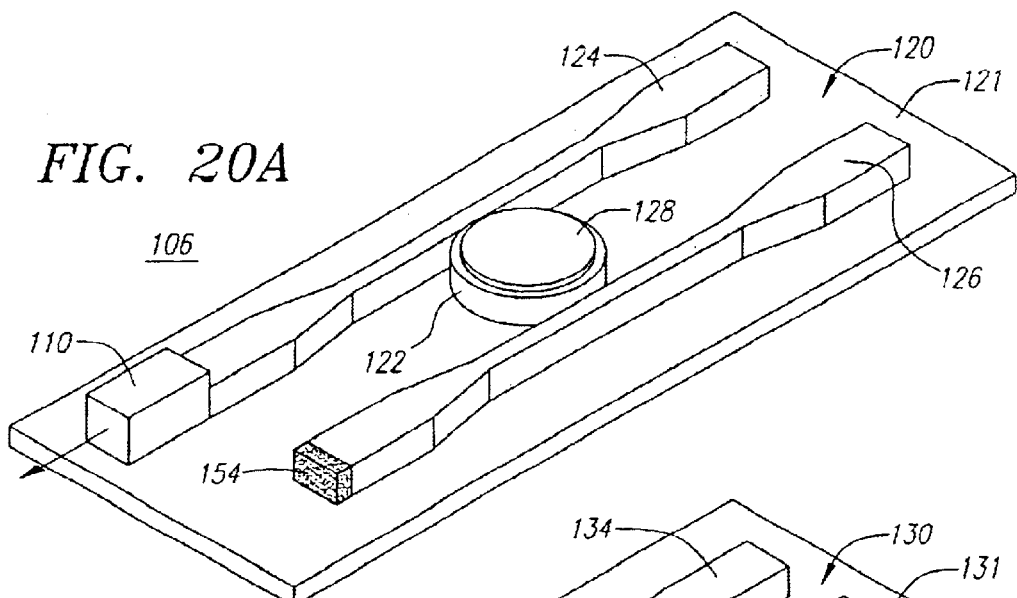
FIG. 20A is a schematic view of a seventh embodiment of a tunable laser of the present invention using a monolithic integration process in which the laser diode and the waveguide-coupled resonator are grown on the same substrate.
Figure 20B:
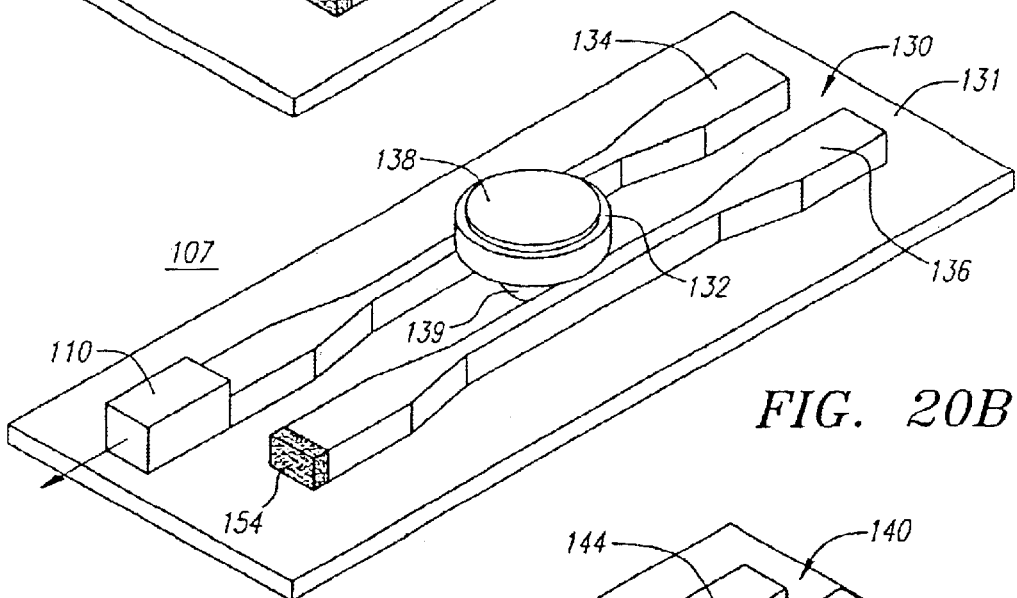
FIG. 20B is a schematic view of an alternative to the seventh embodiment of a tunable laser shown in FIG. 20A with a vertical coupling configuration.
Figure 20C:
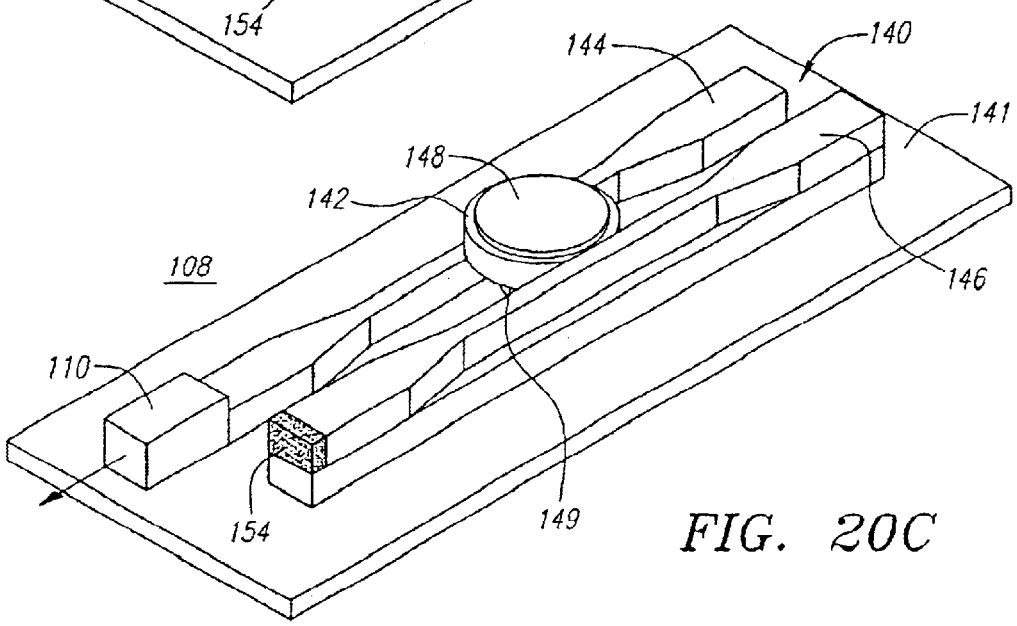
FIG. 20C is a schematic view of another alternative to the seventh embodiment of a tunable laser shown in FIG. 20A with a vertical coupling configuration having waveguides positioned above and below the resonator.

Monolithic integrated tunable lasers 106, 107, and 108 of the present invention are shown in FIGS. 20A, 20B and 20C, respectively, to include a semiconductor laser diode 110 integrated with a waveguide-coupled resonator 120, 130 and 140 on the same substrate 121, 131 and 141. Monolithic integration may be accomplished using regrowth methods, i.e., the laser diode layers 110 are grown first on the substrate 121, 131 and 141 and then the chip is made with the standard semiconductor wafer fabrication processes. Some areas on the substrate are etched away and the layers for the waveguide-coupled resonator 120, 130 and 140 are then grown. Again, standard semiconductor fabrication processes are used to define the waveguide-coupled resonator 120, 130 and 140. It is advantageous, however, to have one of the end facets of the laser diode 110 well aligned and coupled to the first waveguide 124, 134 and 144 of the waveguide-couple resonator 120, 130 and 140. The butt-joint coupling method, which has been demonstrated in narrow-linewidth DBR lasers and integrated DFB laser/electroabsorption modulators, results in nearly 100% coupling efficiency. Preferably, high reflection coating 154 is deposited on one end facet of the second waveguide 126, 136 and 146. The reflectivity for such coatings may be more than 90%. The waveguide-coupled resonator 120, 130 and 140 may also comprise multiple resonators to improve the performance as discussed above.

Figure 21A:
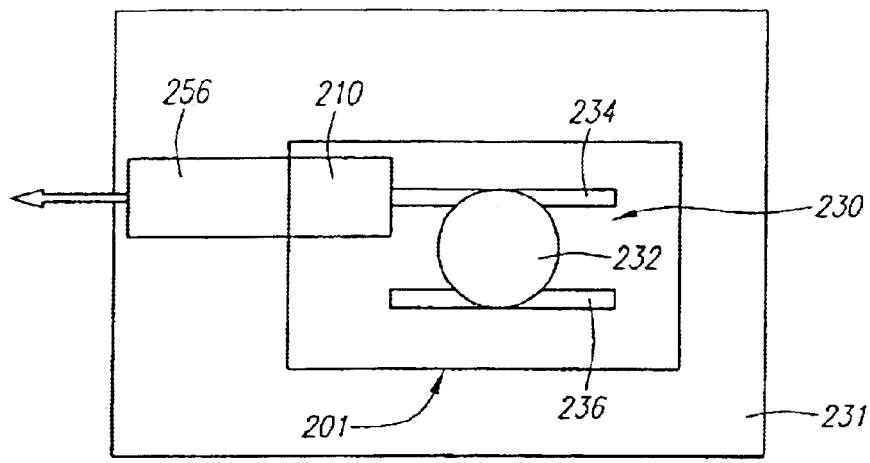
FIG. 21A is a schematic view of an eighth embodiment of a tunable laser of the present invention using a monolithic integration process in which the laser diode and the waveguide-coupled resonator are grown on the same substrate and are monolithically integrated with an electro-absorption modulator.

The tunable laser of the present invention is also adaptable to more advanced monolithic integrations, i.e., more optical devices can be integrated with the tunable laser into the same substrate and, thus, more complex functions can be realized. For example, as shown in FIG. 21A, an optical device 200, such as a tunable transmitter or transponder, may comprise an electro-absorption (EA) modulator 256 fabricated on the same substrate 231 right after the tunable laser 201 wherein the output from the tunable laser 201 can be modulated. The tunable laser 201 includes a laser diode 210 coupled to a waveguide-coupled resonator 230 comprising a resonator 232 coupled to first and second waveguides 234 and 236 with a H.R. coating applied to an end facet of the second waveguide 236.

Figure 21B:
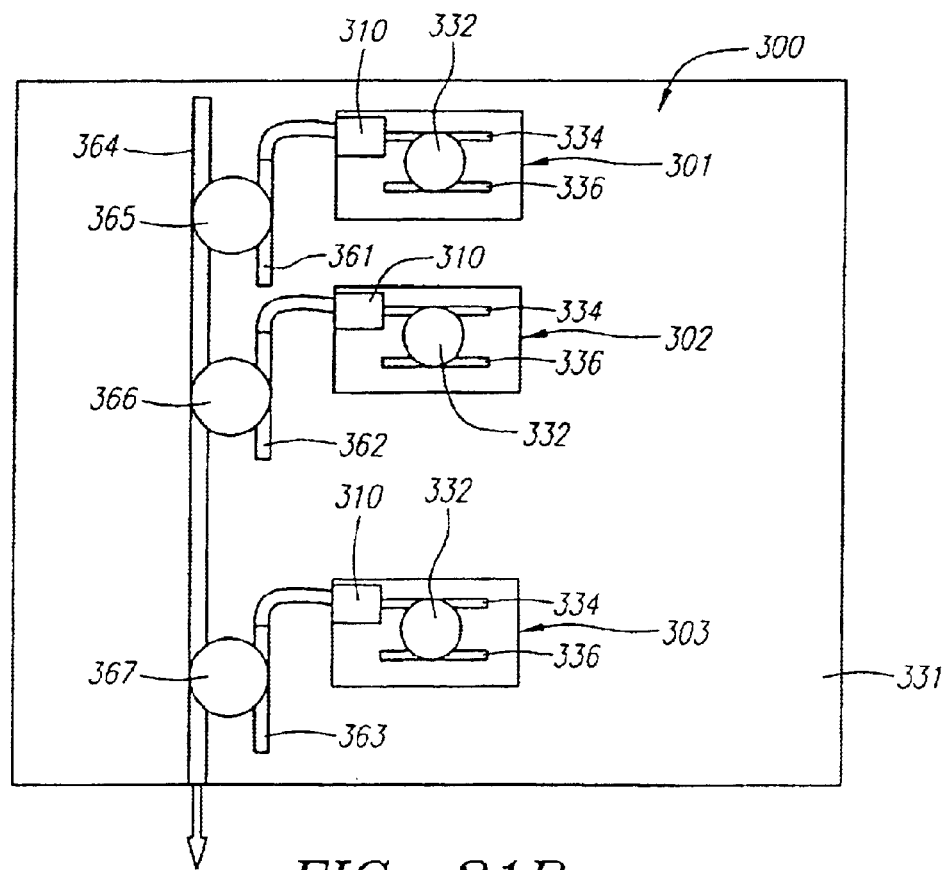
FIG. 21B is a schematic view of a ninth embodiment of a tunable laser of the present invention in which an array of tunable lasers are monolithically integrated with a mutliplexer which is also based on waveguide-coupled optical resonators.

Another example, as shown in FIG. 21B, is the use of a waveguide-coupled resonator 360 to multiplex the outputs from multiple tunable lasers 301, 302 and 303 to form a waveguide bus 300. Preferably, the waveguide-couple resonator 360 comprises separate input waveguides 361, 362 and 363 coupled to the outputs from separate tunable lasers 301, 302 and 303. The tunable lasers comprise a laser diode 310 coupled to a waveguide-coupled optical resonator comprising first and second waveguides 334 and 336 coupled to an optical resonator 332. Light entering the input waveguides 361, 362 and 363 from the tunable lasers 301, 302 and 303 having wavelengths equal to a resonance frequency of the resonators 365, 366 and 367 is transferred to the resonators and onto the output waveguide 364 by evanescent coupling.

Figure 22A:
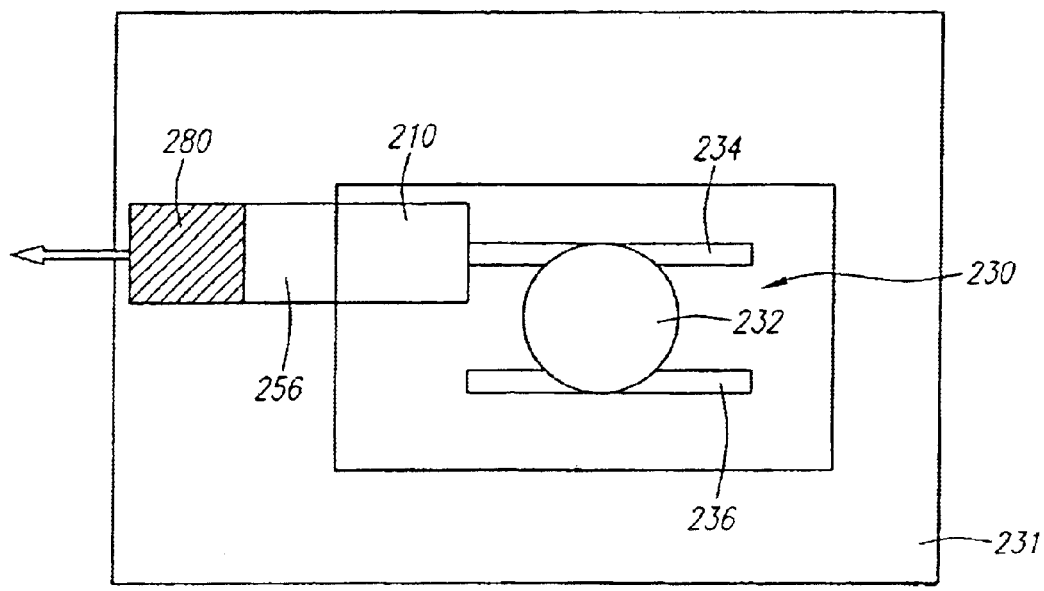
FIG. 22A is a schematic view of an alternative to the eighth embodiment of a tunable laser shown in FIG. 21A in which an amplifier is monolithically integrated into the system adjacent the electro-absorption modulator.
Figure 22B:
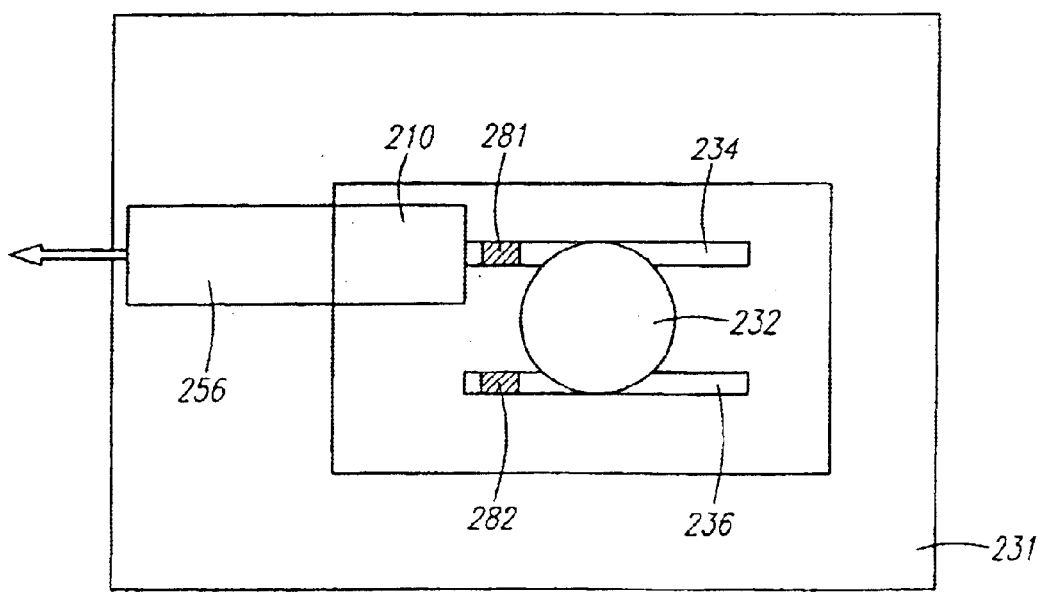
FIG. 22B is a schematic view of another alternative to the eighth embodiment of a tunable laser shown in FIG. 21A in which amplifiers are monolithically integrated into the waveguides of the system.

In addition, the optical devices of the present invention may be made virtually lossless by integrating amplifiers into the devices. As shown in FIGS. 22A and 22B, the optical device 200 shown in FIG. 21A may be modified by integrating an external gain section 280 into the optical device 200*a* adjacent to the EA modulator 256 or by making part of the waveguides 234 and 236 of the optical device 200*b* into amplifiers 281 and 282. By injecting current into these gain sections, additional optical gain is provided for the light and lower threshold lasing can be achieved.

While the invention is susceptible to various modifications and alternative forms, specific embodiments thereof have been shown in the drawings and are herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A wavelength tunable laser comprising
   a laser diode, and
   a wavelength selective external cavity, the external cavity including a resonator formed of electro-optic material and having an adjustable refractive index induced tunable resonance wavelength, and first and second waveguides optically coupled to the resonator along first and second coupling regions wherein light traveling through the waveguides having a wavelength matching a tuned resonance wavelength of the resonator is coupled into the resonator through evanescent wave coupling, the first and second waveguides being parallelly disposed in a lateral direction adjacent and extending beyond the first and second coupling regions, the first waveguide having a first end optically coupled to the laser diode, and the second waveguide having one end optically coupled to a reflector.

2. The tunable laser of claim 1 wherein the first and second waveguides are horizontally coupled to the resonator such that evanescent wave coupling between the resonator and first and second waveguides is directed in a generally orthogonally direction between the first and second waveguides.

3. The tunable laser of claim 1 wherein the resonator and the first and second waveguides are spaced apart a predetermined distance along the first and second coupling regions forming evanescent wave coupling gaps there between.

4. The tunable laser of claim 1 wherein the resonator comprises a plurality of resonators wherein adjacent resonators are spaced apart a predetermined distance to cause a constructive interference effect among the resonators the plurality of resonators.

5. The tunable laser of claim 1 further comprising a coupling lens interposing an end facet of the laser diode and an end facet of the first end of the first waveguide.

6. The tunable laser of claim 1 wherein the laser diode is butt-joint coupled to an end facet of the first end of the first waveguide.

7. The tunable laser of claim 1 wherein the reflector comprises a reflection coating applied to an end facet on the one end of the second waveguide, wherein the reflection coating has a reflectivity of about 100% within the tunable laser device working wavelength range.

8. The tunable laser of claim 1 wherein at least one of the first and second waveguides includes an amplifier.

9. The tunable laser of claim 1 further comprising first and second electrodes formed on opposite sides of the resonator.

10. The tunable laser of claim 1 wherein each of the first and second waveguides has two ends that are thicker than a central portion thereof.

11. The tunable laser of claim 1 wherein the reflector comprises a mirror positioned adjacent an end facet on the one end of the second waveguide coupled to the reflector.

12. The tunable laser of claim 11 further comprising a collimated lens interposing the mirror and the one end of the second waveguide coupled to the reflector.

13. The tunable laser of claim 1 wherein the laser diode comprises a muli-layer semiconductor wafer structure including first and second end facets.

14. The tunable laser of claim 13 wherein one of the first and second end facets is coated with an anti-reflection coating.

15. The tunable laser of claim 1 wherein the laser diode and external cavity are formed on a single substrate.

16. The tunable laser of claim 15 further comprising an electro-absorption modulator formed on the substrate with the laser diode and external cavity and positioned adjacent an output end facet of the laser diode.

17. The tunable laser of claim 16 further comprising an external gain section formed adjacent the electro-absorption modulator.

18. The tunable laser of claim 1 wherein the first and second waveguides are vertically coupled to the resonator such that evanescent wave coupling between the resonator and first and second waveguides is generally orthogonally directed relative to a plane generally defined by a top surface of the resonator and planes generally defined by a top surface of each of the first and second waveguides that extend in the lateral direction and generally parallel to the resonator plane.

19. The tunable laser of claim 18 wherein the first and second waveguides and the resonator are formed on a single substrate comprising a plurality of layers.

20. The tunable laser of claim 19 wherein the plurality of layers includes a separation layer interposing a resonator core layer and a waveguide layer.

21. The tunable laser of claim 20 wherein the first and second waveguides are formed in a single layer.

22. The tunable laser of claim 20 wherein the first and second waveguides are formed in different layers.

* * * * *